(12) United States Patent
Oh et al.

(10) Patent No.: US 9,437,310 B2
(45) Date of Patent: Sep. 6, 2016

(54) METHOD OF OPERATING A MEMORY SYSTEM HAVING AN ERASE CONTROL UNIT

(71) Applicants: Eun Chu Oh, Hwaseong-si (KR); Hong Rak Son, Anyang-si (KR); Junjin Kong, Yongsin-si (KR)

(72) Inventors: Eun Chu Oh, Hwaseong-si (KR); Hong Rak Son, Anyang-si (KR); Junjin Kong, Yongsin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/827,930

(22) Filed: Aug. 17, 2015

(65) Prior Publication Data

US 2016/0093387 A1 Mar. 31, 2016

(30) Foreign Application Priority Data

Sep. 30, 2014 (KR) ........................ 10-2014-0131593

(51) Int. Cl.

| G11C 16/10 | (2006.01) |
|---|---|
| G11C 16/16 | (2006.01) |
| G11C 11/56 | (2006.01) |
| G11C 16/34 | (2006.01) |
| G11C 16/26 | (2006.01) |

(52) U.S. Cl.
CPC ........... *G11C 16/16* (2013.01); *G11C 11/5635* (2013.01); *G11C 16/3468* (2013.01); *G11C 16/26* (2013.01)

(58) Field of Classification Search
CPC .......................... G11C 16/0483; G11C 16/10
USPC ........................................ 365/185.11, 185.24
See application file for complete search history.

(56) References Cited

U.S. PATENT DOCUMENTS

| 7,467,253 | B2 | 12/2008 | Yero |
| 7,679,133 | B2 | 3/2010 | Son et al. |
| 7,835,193 | B2 | 11/2010 | Lee |
| 8,018,774 | B2 | 9/2011 | Hwang et al. |
| 8,254,183 | B2 | 8/2012 | Park |
| 8,305,812 | B2 | 11/2012 | Levy et al. |
| 8,380,915 | B2 | 2/2013 | Wood et al. |
| 8,462,551 | B2 | 6/2013 | Kim |
| 8,553,466 | B2 | 10/2013 | Han et al. |
| 8,559,235 | B2 | 10/2013 | Yoon et al. |
| 8,576,635 | B2 | 11/2013 | Kim et al. |
| 8,630,123 | B2 | 1/2014 | Jeong et al. |
| 8,654,587 | B2 | 2/2014 | Yoon et al. |
| 8,661,184 | B2 | 2/2014 | Wood et al. |
| 2006/0018163 | A1* | 1/2006 | Kwon ............... G11C 16/3445 365/185.29 |
| 2010/0199150 | A1* | 8/2010 | Shalvi ................. G11C 29/52 714/773 |
| 2011/0233648 | A1 | 9/2011 | Seol et al. |
| 2012/0069681 | A1 | 3/2012 | Oikawa |
| 2012/0239858 | A1 | 9/2012 | Melik-Martirosian |
| 2013/0250675 | A1* | 9/2013 | Hung ..................... G11C 16/14 365/185.02 |
| 2014/0019675 | A1 | 1/2014 | Oh et al. |
| 2014/0108891 | A1 | 4/2014 | Strasser et al. |

\* cited by examiner

FOREIGN PATENT DOCUMENTS

| KR | 10-0895855 | 5/2009 |
| KR | 1020100045674 A | 5/2010 |

*Primary Examiner* — Michael Tran
(74) *Attorney, Agent, or Firm* — Myers Bigel & Sibley, P.A.

(57) ABSTRACT

A method of operating a memory system including a nonvolatile memory including a memory block, and a memory controller including an erase control unit, includes performing pre-reading a plurality of memory cells connected to a selected word line of the memory block, generating an off cell count based on the pre-reading result, by operation of the erase control unit, comparing the off cell count with a reference value to generate a comparison result, and changing an erase operation condition based on the comparison result, by operation of the nonvolatile memory, and erasing the memory block according to the changed erase operation condition.

17 Claims, 25 Drawing Sheets

Off Cell Count

| Off Cell Count (OCC) | Erase condition | Voltage Level (V) | Erase pulse Duration (ms) |
|---|---|---|---|
| OCC ≥ 30 | default | 19 | 10 |
| OCC < 30 | change | 18 | 9 |

FIG. 13

| Off Cell Count (OCC) | Erase Class | Voltage Level (V) | Erase pulse Duration (ms) |
|---|---|---|---|
| OCC ≤10 | 1 | 17 | 8 |
| OCC ≤20 | 2 | 17.5 | 8.5 |
| OCC ≤30 | 3 | 18 | 9 |
| OCC ≤40 | 4 | 18.5 | 9.5 |
| OCC >40 | 5 | 19 | 10 |

| $V_{diff}$ | Erase class | Voltage Level (V) | Erase pulse Duration (ms) |
|---|---|---|---|
| $V_{diff} \geq 500mv$ | 1 | 17 | 8 |
| $V_{diff} \geq 400mv$ | 2 | 17.5 | 8.5 |
| $V_{diff} \geq 300mv$ | 3 | 18 | 9 |
| $V_{diff} \geq 200mv$ | 4 | 18.5 | 9.5 |
| $V_{diff} < 200mv$ | 5 | 19 | 10 |

| Retention Time (S) | Erase class | Voltage Level (V) | Erase pulse Duration (ms) |
|---|---|---|---|
| RT ≥ 30000 | 1 | 17 | 8 |
| RT ≥ 25000 | 2 | 17.5 | 8.5 |
| RT ≥ 20000 | 3 | 18 | 9 |
| RT ≥ 15000 | 4 | 18.5 | 9.5 |
| RT < 15000 | 5 | 19 | 10 |

| T diff (°C) | Erase class | Voltage Level (V) | Erase pulse Duration (ms) |
|---|---|---|---|
| $T_{diff} \geq 50$ | 1 | 17 | 8 |
| $T_{diff} \geq 40$ | 2 | 17.5 | 8.5 |
| $T_{diff} \geq 30$ | 3 | 18 | 9 |
| $T_{diff} \geq 20$ | 4 | 18.5 | 9.5 |
| $T_{diff} < 20$ | 5 | 19 | 10 |

METHOD OF OPERATING A MEMORY SYSTEM HAVING AN ERASE CONTROL UNIT

CROSS-REFERENCE TO RELATED APPLICATION

This U.S. non-provisional patent application claims priority under 35 USC §119 to Korean Patent Application No. 10-2014-0131593 filed on Sep. 30, 2014, the subject matter of which is hereby incorporated by reference herein.

BACKGROUND

The inventive concept relates generally to memory systems, memory devices, and methods of operating a memory system. More particularly, the inventive concept relates to methods of operating a memory system including a nonvolatile memory device and an erase operation.

Memory systems including one or more nonvolatile semiconductor memory devices have become staple components in contemporary consumer electronic products. A variety of nonvolatile semiconductor memory devices are known, including as examples, the electrically erasable programmable read only memory (EEPROM), the phase-change random access memory (PRAM), the magnetic random access memory (MRAM), and the resistance read only memory (ReRAM). Within the broad class of nonvolatile semiconductor memory devices, flash memory provides certain advantages, such as rapid reading speed, low power consumption, very dense data storage capacity, etc. As a result, many contemporary memory systems incorporated in contemporary digital computational platforms and consumer electronics include flash memory as a data storage medium.

A charge trap flash (called "CTF") memory device may be applied to 3-dimensional structure flash memory (3D flash memory) to overcome a physical limit of high-integration. Such configurations tend to increase the per unit area, data-storage integration density of the constituent nonvolatile flash memory device.

However, CTF memory cells are not without their own challenges. In particular, CTF memory cells often suffer from a phenomenon referred to as "initial verify shift" or "IVS". This phenomenon is characterized by an undesired rearrangement or recombination of charge carriers (electrons and/or holes) on a charging storage layer of CTF memory cells following execution of a program operation or an erase operation.

Such charge carrier rearrangement tends to shift the threshold voltage of the CTF memory cells in a manner that may lead to data loss. Most troubling, the IVS phenomenon happens over a period of time following the programming (or erasing) of memory cells, and as such, memory cells already verified as having been properly programmed (or erased) may experience a threshold voltage shift that essentially changes the programmed (or erased) state of the memory cell.

SUMMARY

Embodiments of the inventive concept provide a method of operating a memory system including a nonvolatile memory including a memory block, and a memory controller including an erase control unit, the method comprising performing pre-reading a plurality of memory cells connected a selected word line of the memory block, generating a off cell count based on the pre-reading result, by operation of the erase control unit, comparing the off cell count with a reference value to generate a comparison result, and changing an erase operation condition according to the comparison result, by operation of the nonvolatile memory, erasing the memory block based on the changed erase operation condition.

In one embodiment, the inventive concept provides the nonvolatile memory comprises a three dimensional flash memory cell array, wherein the performing pre-reading of the plurality of memory cells comprises reading by applying a pre-read voltage to the selected word line, wherein a level of the pre-read voltage is lower than a level of a verify voltage of a uppermost program state, and higher than a level of a read voltage of the uppermost program state. The off cell count is a number of memory cells which have threshold voltages higher than or equal to the pre-read voltage among the pre-reading result, and wherein the reference value is changed based on an operating environment of the memory system.

The changing the erase operation condition is performed upon determining that the off cell count is smaller than the reference value, and the erasing is performed without the changing the erase operation condition upon determining that the off cell count is larger than or equal to the reference value. The changing the erase operation condition is lowering a erase voltage level below a reference erase voltage level. The changing the erase operation condition is shortening a erase voltage pulse than a reference erase voltage pulse. the memory controller comprises a Random Access Memory (RAM) or a Read Only Memory (ROM) configured to store a value of the off cell count and the changed erase operation condition.

In another embodiment, the inventive concept provides a method of operating a memory system including a nonvolatile memory including a memory block, and a memory controller including an erase control unit, the method comprising generating read data by applying a first read voltage to a word line of the memory block, generating a off cell count based on the read data, by operation of the erase control unit, determining a erase class among a plurality of erase classes based on the off cell count, determining an erase operation condition according to the determined erase class, by operation of the nonvolatile memory, erasing the memory block b the determined erase operation condition.

The off cell count is a number of memory cells which have threshold voltages higher than the first read voltage, wherein a level of the first read voltage is lower than a program verify voltage level of a first program state, and higher than a program verify voltage level of a second program state, wherein the first program state is an uppermost program state, the second program state is a lower program state adjacent to the uppermost program state.

The plurality of the erase classes comprises at least three erase classes, if the off cell count is less than or equal to a first reference value, the erase class of the memory block is a first erase class, if the off cell count is greater than the first reference value, and less than or equal to a second reference value, the erase class of the memory block is a second erase class, if the off cell count is greater than the second reference value, the erase class of the memory block is a third erase class. The first erase class is configured to provide a first erase voltage, the second erase class is configured to provide a second erase voltage, the third erase class is configured to provide a third erase voltage, wherein the second erase voltage is higher than the first erase voltage, and lower than the third erase voltage.

The first erase class is configured to provide a first erase pulse, the second erase class is configured to provide a second erase pulse, the third erase class is configured to provide a third erase pulse, wherein the second erase pulse is longer than the first erase pulse, and shorter than the third erase pulse. the memory controller comprises a RAM, wherein the RAM is configured to store the off cell count and the determined erase class. The nonvolatile memory comprises a three dimensional flash memory cell array.

In another embodiment, the inventive concept provides a method of operating a memory system including a nonvolatile memory including a memory block, and a memory controller including a erase control unit, the method comprising checking a program verify voltage level of a first word line of the memory block, checking a read voltage level of the first word line, by operation of the erase control unit, calculating a voltage difference between the program verify voltage level and the read voltage level, determining a erase class among a plurality of erase classes based on the voltage difference, by operation of the memory controller, erasing the memory block of the nonvolatile memory based on the determined erase class.

The program verify voltage is a voltage to verify an uppermost program state, wherein the read voltage is a voltage to read the uppermost program state. The plurality of the erase classes comprises at least two erase classes, if the voltage difference is greater than or equal to a first reference value, the erase class of the memory block is a first erase class, if the voltage difference is less than the first reference value, the erase class of the memory block is a second erase class. The first erase class is configured to provide a first erase voltage, and the second erase class is configured to provide a second erase voltage, wherein the second erase voltage is higher than the first erase voltage. The first erase class is configured to provide a first erase pulse, and the second erase class is configured to provide a second erase pulse, wherein the second erase pulse is longer than the first erase pulse.

In another embodiment, the inventive concept provides a method of operating a memory controller including an erase control unit, and controlling a nonvolatile memory including a memory block, the method comprising storing a program finish time of a first word line of the memory block, generating a retention time based on the stored program finish time and a erase start time of the memory block, by operation of the erase control unit, determining an erase class among a plurality of erase classes based on the generated retention time, erasing the memory block of the nonvolatile memory based on the determined erase class.

The program finish time is a time when a programming is completed at the first word line, wherein the erase start time is a time when a command erasing the memory block is invoked. The plurality of erase class comprises at least two erase class, if the retention time is shorter than a first reference time, the erase class of the memory block is a first erase class, if the retention time is longer than or equal to the first reference time, the erase class of the memory block is a second erase class.

The first erase class is configured to provide a first erase voltage, and the second erase class is configured to provide a second erase voltage, wherein the first erase voltage is higher than the second erase voltage. The first erase class is configured to provide a first erase pulse, and the second erase class is configured to provide a second erase pulse, wherein the first erase pulse is longer than the second erase pulse.

In another embodiment, the inventive concept provides a method of operating a memory controller including an erase control unit, and controlling a nonvolatile memory including a memory block, the method comprising storing a program temperature of a first word line of the memory block, calculating a temperature difference based on the stored program temperature and a erase temperature, by operation of the erase control unit, determining an erase class among a plurality of erase classes based on the calculated temperature difference, erasing the memory block of the nonvolatile memory based on the determined erase class.

The program temperature is a temperature of the nonvolatile memory when a programming of the first wordline is performed, wherein the erase temperature is a temperature of the nonvolatile memory when a erase command of the memory block is provided. The plurality of retention classes comprises at least two erase classes, if the temperature difference is less than a first reference value, the erase class of the memory block is a first erase class, if the temperature difference is greater than or equal to the first reference value, the erase class of the memory block is a second erase class. The first erase class is configured to provide a first erase voltage, and the second erase class is configured to provide a second erase voltage, wherein the first erase voltage is higher than the second erase voltage. The first erase class is configured to provide a first erase pulse, and the second erase class is configured to provide a second erase pulse, the first erase pulse is longer than the second erase pulse.

In another embodiment, the inventive concept provides a method of operating a memory controller including an erase control unit, and controlling a nonvolatile memory including a memory block, the method comprising a program retention time of the memory block and a reference retention time, generating read data by applying a read voltage to a word line of the memory block according to the compared result, generating an off cell count based on the generated read data, by operation of the erase control unit, determining a erase class among a plurality of erase classes according to the generated off cell count, by operation of the nonvolatile memory, erasing the memory block based on a erase operation condition of the determined erase class.

The program retention time is a time difference between a program completion time of the word line of the memory block and an erase command invocation for of the memory block. The memory controller is configured to change the reference retention time based on an operation condition of the nonvolatile memory. A level of the read voltage is lower than a program verify voltage level of an uppermost program state, and higher than a program verify voltage level of a lower program state adjacent to the uppermost program state.

The off cell count is a number of memory cells which have threshold voltages higher than the first read voltage. The plurality of the erase classes comprises at least two erase classes, The determining the erase class comprises if the off cell count is less than or equal to a first reference value, the erase class of the memory block is a first erase class, if the off cell count is greater than the first reference value, the erase class of the memory block is a second erase class. The first erase class is configured to provide a first erase voltage, the second erase class is configured to provide a second erase voltage, and the second erase voltage is higher than the first erase voltage. The first erase class is configured to provide a first erase pulse, the second erase class is configured to provide a second erase pulse, wherein the second erase pulse is longer than the first erase pulse. The memory controller comprises a RAM configured to store the off cell count and the determined erase class.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

The above and other features and advantages of the inventive concept will become more apparent upon consideration of certain embodiments of the illustrated in the accompanying drawings.

FIG. 13 is a table illustrating an operations in which the erase control unit of FIG. 1 generates an erase class according to some embodiments of the inventive concept.

DETAILED DESCRIPTION

Figure 1:
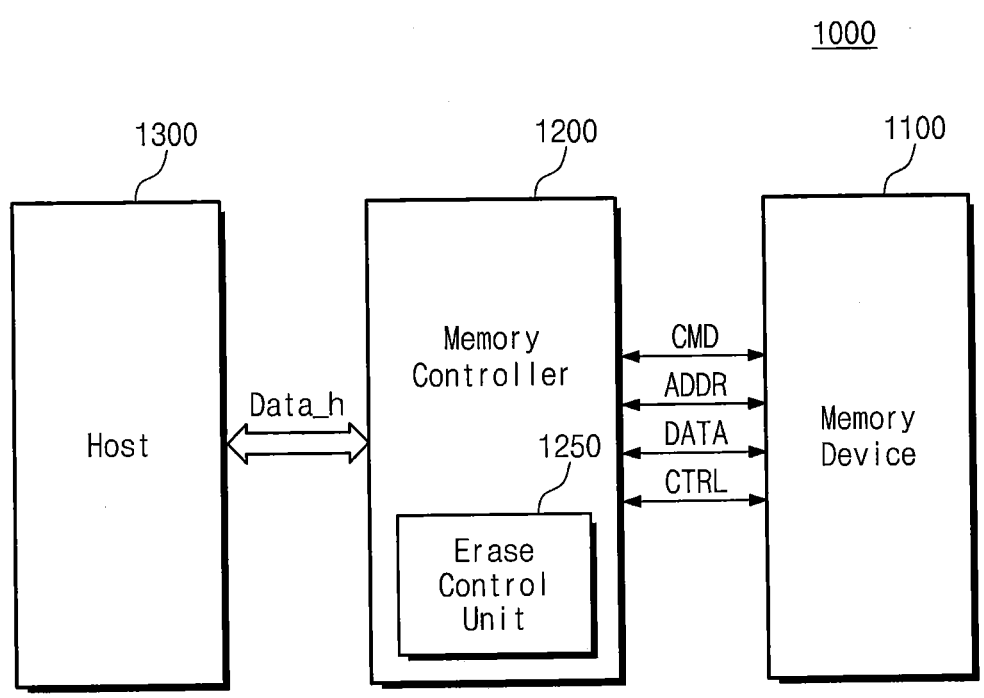
FIG. 1 is a block diagram illustrating a memory system according to some embodiments of the inventive concept.

Certain embodiments of the inventive concept will now be described with reference to the accompanying drawings. However, the inventive concept may be variously embodied and should not be construed as being limited to only the illustrated embodiments. Throughout the written description and drawings, like reference numbers denote like or similar elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion e.g., "between" versus "directly between", "adjacent" versus "directly adjacent", etc.

The terminology used herein is for the purpose of describing particular embodiments only and is not intended to be limiting of example embodiments of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in relation to certain illustrated embodiments, certain functions, acts, and/or steps may be performed in an order other than the specific order described in relation to illustrated embodiments. Further, two or more functions, acts and/or steps shown as occurring in succession may, in fact, be executed substantially concurrently or may sometimes be executed in a reverse order depending on the functionality, acts and/or steps involved.

Unless otherwise defined, all terms, including technical and scientific terms, used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

I. Memory System Including a Erase Control Unit

FIG. 1 is a block diagram illustrating a memory system according to an embodiment of inventive concept. Referring to FIG. 1, a memory system 1000 comprises a memory device 1100, a memory controller 1200 and host 1300.

The memory device 1100 may be operationally controlled by the memory controller 1200 to perform a sequence of variously defined "operations" in response to one or more requests, commands, and/or instructions received from the host 1300. Operations may vary in definition between different memory systems, but will typically include at least read, write (or program), and/or erase operations, as well as certain housekeeping operations necessary to the efficient overall performance of the memory system 1000. The memory device 1100 may include a plurality of memory blocks.

The memory controller 1200 is functionally connected between the memory device 1100 and the host 1300. The memory controller 1200 may control read and/or write operations of the memory device 1100 in response to requests of the host 1300. The memory controller 1200 may be used to receive host-defined data (e.g., write data or incoming data, generally designated "Data_h"), and to receive memory device-defined data (e.g., read data retrieved from the memory device 1100 during a read or similar operation, generally designated "DATA").

In addition to controlling exchanges of various data between the host 1300 and memory device 1100, the memory controller 1200 may also be used to generate and communicate various command information (CMD) and address information (ADDR) related to the exchange of various data, as well as one or more control signals (CTRL) to the memory device 1100.

In the illustrated embodiment of FIG. 1, the memory controller 1200 comprises an erase control unit 1250. The erase control unit 1250 may be variously implemented using hardware, firmware and/or software components provided by the memory controller 1200. The erase control unit 1250 may control an erase operation. The erase control unit 1250 may measure the threshold voltage change degree (or IVS phenomenon) of memory cells. The erase control unit 1250 may change an erase operation condition according to the measurement result.

In the illustrated embodiment of the inventive concepts, the memory system 1000 may perform the erase operation condition changing if a block erase is requested to generate a free block. According to the inventive concepts, the memory system may perform the erase operation condition change by considering the IVS phenomenon when receiving an erase command of the memory device 1100. According to the inventive concepts, the memory system 1000 may reduce degradation to an oxide film, which may occur during erase operation of the memory device 1100, and prolong lifespan of the memory device 1100.

Figure 2:
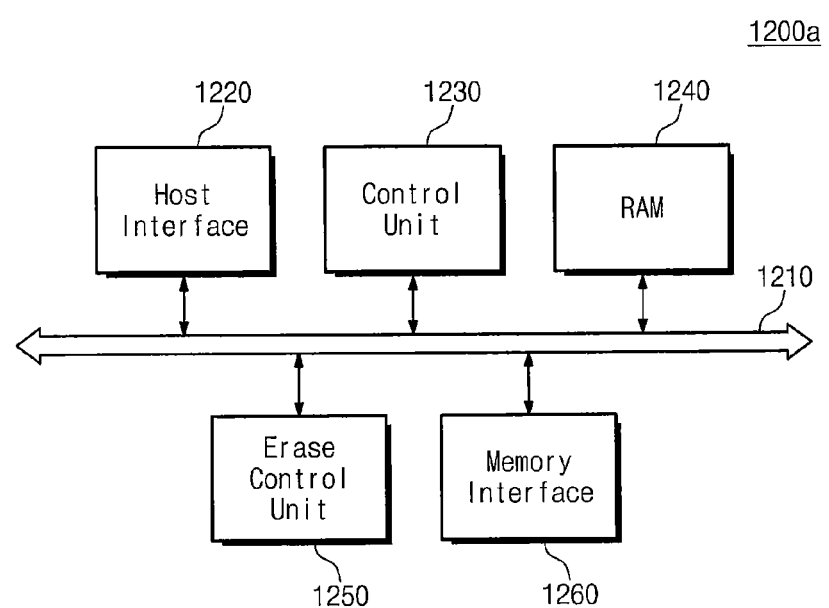
FIG. 2 is a block diagram further illustrating an example of the memory controller of FIG. 1.

FIG. 2 is a block diagram further illustrating in one example the memory controller of FIG. 1. Referring to the FIG. 2, the memory controller 1200a comprises in relevant part: a system bus 1210, a host interface 1220, control unit 1230, a Random Access Memory (RAM) 1240, the erase control unit 1250, and a memory interface 1260.

The system bus 1210 generally provides a connection channel between the various elements of the memory controller 1200a noted above.

The host interface 1220 may be used to enable communication with the host 1300 using one or more communication standard(s). For example, the host interface 1220 may enable one or more communication standards, such as Universal Serial Bus (USB), Peripheral Component Interconnection (PCI), PCI-express (PCI-E), Advanced Technology Attachment (ATA), Serial-ATA, Parallel-ATA, Small Computer Small Interface (SCSI), Enhanced Small Disk Interface (ESDI), Integrated Drive Electronics (IDE), fire-wire, etc.

The control unit 1230 may be used to receive host-defined data (Data_h) as well as related command and address information from the host 1300, and to control the overall operation of the memory controller 1200. The control unit 1230 may include Read Only Memory (ROM, not shown). The control unit 1230 may control the overall operation of the memory controller 1200 using stored information in the ROM.

The RAM 1240 may be used to as a cache or buffer memory to temporarily store data (e.g., Data_h and/or DATA), command information, address information, computational information, and other types of data and/or information to facilitate the functionality of the memory controller 1200.

As described above in relation to FIG. 1, the erase control unit 1250 may be used to manage an erase operation condition. The erase control unit 1250 may measure the IVS phenomenon, and change the erase operation condition based on the measurement result. The operating principles of the erase control unit 1250 in the context of the inventive concept will be described in additional detail with reference to the embodiments illustrated in FIGS. 7 and 25 for example.

The memory interface 1260 may be used to enable communication of data between the memory controller 1200 and the memory device 1100. For example, the memory interface 1260 may be a NAND type flash memory interface, or a vertical NAND (VNAND) type flash memory interface, etc.

Figure 3:
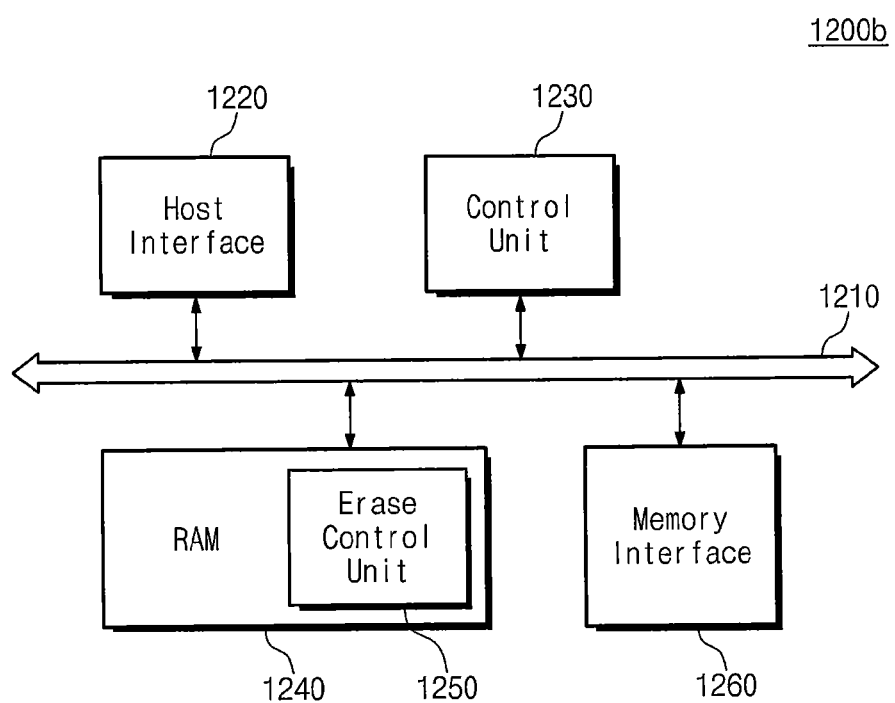
FIG. 3 is a block diagram further illustrating another example of the memory controller of FIG. 1.

FIG. 3 is a block diagram further illustrating in another example (1200b) of the memory controller 1200 of FIG. 1.

The elements described in relation to the memory controller 1200a of FIG. 2 are respectively the same as those shown in FIG. 3, except that certain software components used to implement the erase control unit 1250 are shown as being specifically stored by the RAM 1240 during operation of the memory controller 1200b.

The memory device according to embodiments of the inventive concept, may be applied not only to a 2-dimensional structure flash memory but also to a 3-dimensional structure flash memory 3D Flash memory according to some embodiments of the inventive concept.

Figure 4:
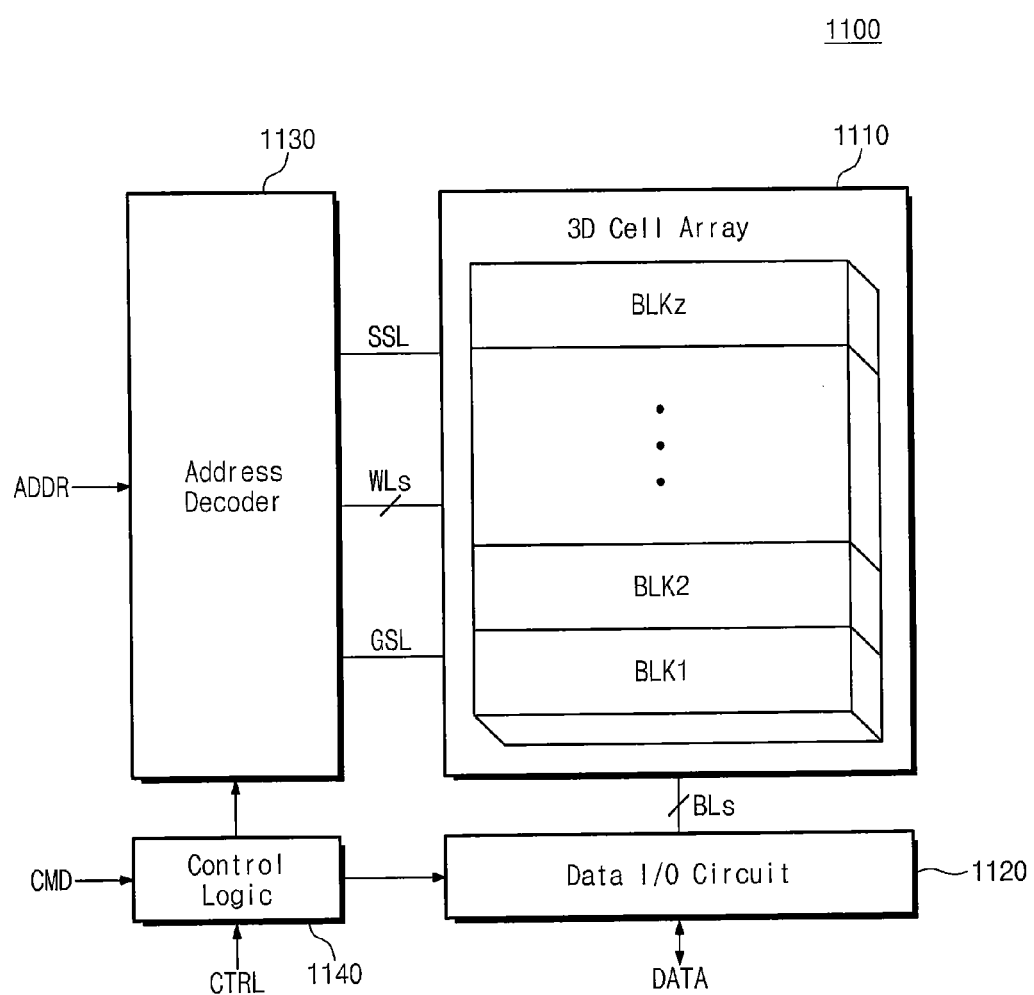
FIG. 4 is a block diagram further illustrating the memory device of FIG. 1 according to some embodiments of the inventive concept.

FIG. 4 is a block diagram further illustrating in one example the memory device 1100 being implemented, wholly or in part, to include a three-dimensional (3D) flash memory according to some embodiments of the inventive concept. Thus, referring to FIG. 4, the memory device 1110 comprises a 3D flash memory cell array 1110, a data input/output (I/O) circuit 1120, an address decoder 1130, and control logic 1140.

The 3D flash memory cell array 1110 is also logically and/or physically partitioned into a plurality of memory blocks (BLK1 to BLKz), wherein each memory block has a three-dimensional (or vertical) structure. Each memory block being an erasable unit for the memory device 1100.

The data I/O circuit 1120 may be used to functionally connect a plurality of bit lines extending across the 3D flash memory cell array 1110 to various external circuits. In this configuration, the data I/O circuit 1120 may be used to receive write data (or encoded write data), and may also be used to receive read data retrieved from the 3D flash memory cell array 1110.

The address decoder 1130 may be used to functionally connect a plurality of word lines as well as at least one ground selection line GSL and string selection line SSL extending across the 3D flash memory cell array 1110 to various external circuits. In this configuration, the address decoder 1130 may be used to select one or more word lines in response to received address information ADDR.

The control logic 1140 may be used to control the overall execution of at least write (program), read, erase, and garbage collection operations by the memory device 1100. That is, the control logic 1140 may be used to control operation of the address decoder 1130 such that a specified program voltage is applied to a selected word line during a program operation, and to further control the data I/O circuit 1120 to receive and hold write data to be programmed during the program operation.

Figure 5:
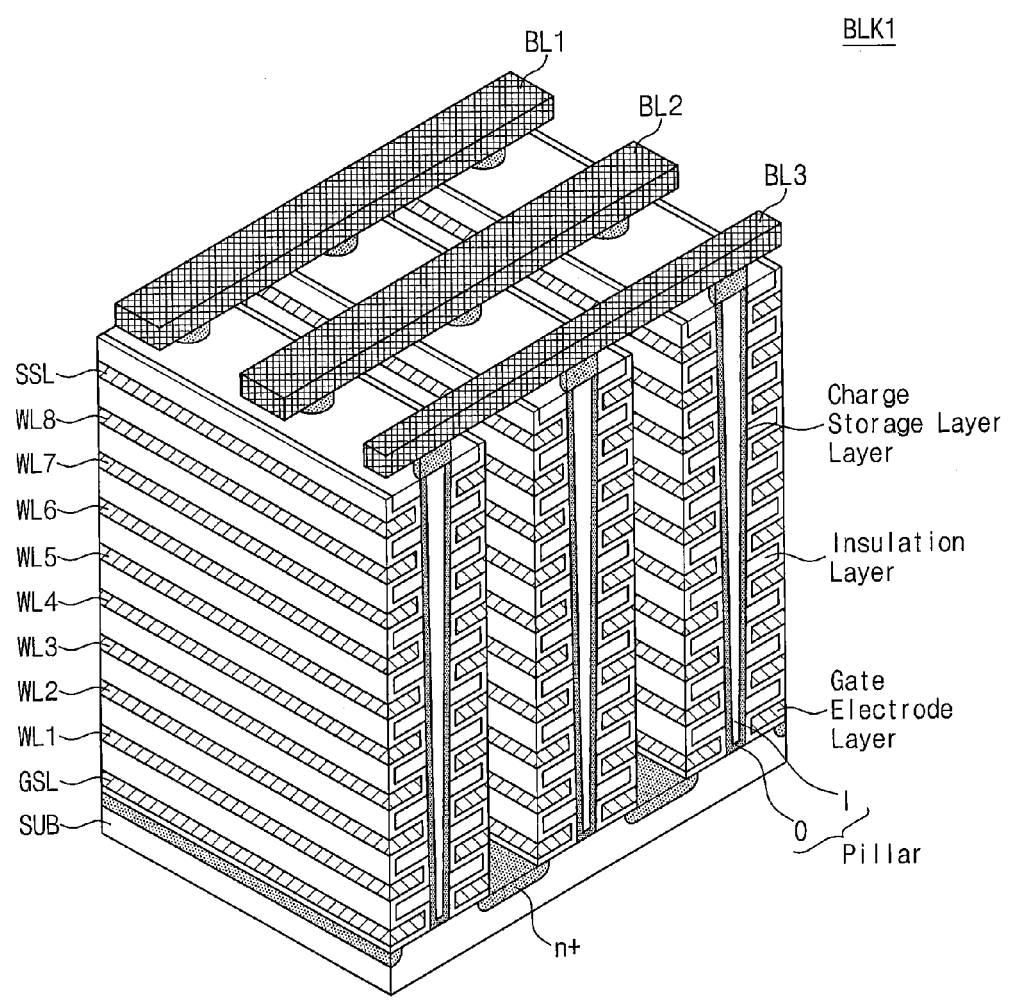
FIG. 5 is a perspective view illustrating an exemplary three-dimensional structure for the memory cell array illustrated in FIG. 4.

FIG. 5 is a perspective view illustrating a portion of a 3D flash memory array corresponding to a first memory block (BLK1) shown in FIG. 4 according to some embodiments of the inventive concept. Referring to FIG. 5, the first memory block, as an example of similarly configured memory blocks, is formed in a direction perpendicular to a principal substrate SUB. An n+ doping region is selectively formed in the substrate. A gate electrode layer and an insulation layer are then sequentially deposited on the substrate. A charge storage layer is formed between the gate electrode layer and the insulation layer.

If the gate electrode layer and the insulation layer are patterned in a vertical direction, a V-shaped pillar is formed. The pillar may thus be connected with the substrate via the gate electrode layer and the insulation layer. An outer portion 'O' of the pillar forms a semiconductor channel, while an inner portion 'I' forms an insulation material (e.g., silicon oxide) around the semiconductor channel.

The gate electrode layer of the memory block BLK1 is connected to a ground selection line GSL, a plurality of word lines WL1 to WL8, and a string selection line SSL. In this manner, the pillar BLK1 is connected with a plurality of bit lines BL1 to BL3. In FIG. 5, there is exemplarily illustrated a case in which one memory block BLK1 has two (2) ground/string selection lines and eight (8) word lines WL1 to WL8. However, embodiments of the inventive concept may have many different signal line definitions.

Figure 6:
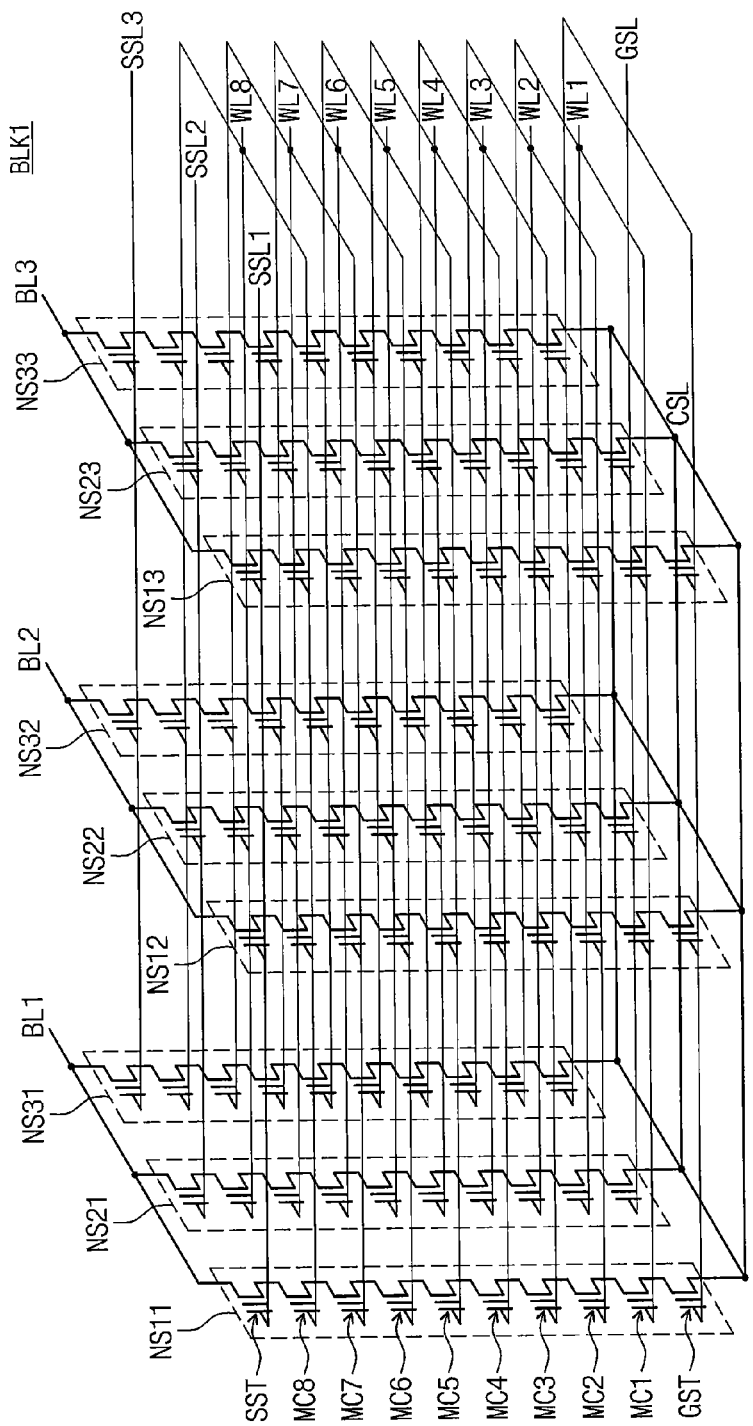
FIG. 6 is an equivalent circuit diagram for the partial memory cell array structure shown in FIG. 5.

FIG. 6 is an equivalent circuit diagram for the first memory block BLK1 shown in FIG. 5. Referring to FIG. 6, NAND strings NS11 to NS33 are connected between bit lines BL1 to BL3 and a common source line CLS. Each NAND string (e.g., NS110) includes a string selection transistor SST, a plurality of memory cells MC1 to MC8, and a ground selection transistor GST.

The string selection transistor SST may be connected to string selection lines SSL1 to SSL3. The memory cells MC1 to MC8 may be connected to corresponding word lines WL1 to WL8, respectively. The ground selection transistor GST may be connected to ground selection lines GSL1 to GSL3. A string selection transistor SST may be connected is to a bit line, and a ground selection transistor GST may be connected to a common source line CLS.

Word lines (e.g., WL1) having the same height may be commonly connected, and the ground selection lines GSL1 to GLS3 and the string selection lines SSL1 to SSL3 may be separated from one from another. During programming of the constituent memory cells of a designated "page" connected to a first word line WL1 and included in NAND strings NS11, NS12, and NS13, a first word line WL1, a first string selection line SSL1, and a first ground selection line may be selected by the various control circuits.

II. Method of Operation the Memory System Including a Erase Control Unit

Figures 7, 8:
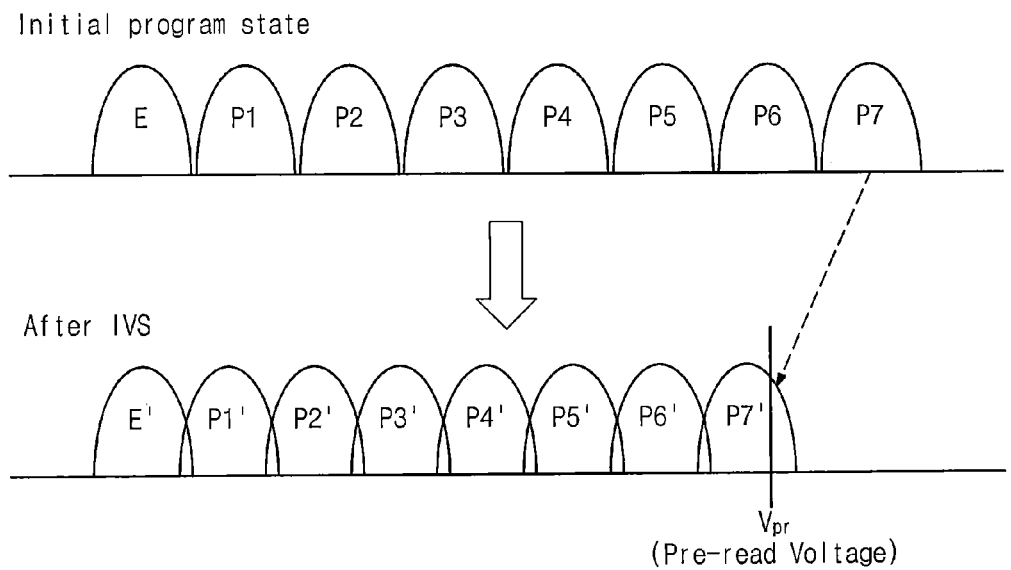
FIG. 7 is a conceptual diagram illustrating a method of operating the memory system including an erase control unit shown in FIG. 1 according to some embodiments of the inventive concept.
FIG. 8 is a diagram illustrating a method of operating the erase control unit that includes changing an erase operation condition according to some embodiments of the inventive concept.

FIG. 7 is a conceptual diagram illustrating operations of the erase control unit 1250 of the memory system 1000 in FIG. 1. FIG. 7 illustrates an operation in which the erase control unit 1250 performs a pre-read to measure the IVS phenomenon degree according to some embodiments of the inventive concept.

Referring to FIG. 7, the erase control unit 1250 may change the erase operation condition by considering the IVS phenomenon degree when a block erase is performed to generate a free block during programming of the memory device 1100. The erase control unit 1250 may change the erase operation condition by considering the IVS phenomenon degree when receiving a erase command. The memory system 1000 (reference FIG. 1) may change the erase operation condition to reduce the oxide film degradation of the memory device 1100, and improve lifespan of the memory device 1100.

Still referring to FIG. 7, the memory cells included in the memory device 1100 may store one or more bits of data per cell. For example, a memory cell may store 3 bits of data. For convenience of description, it is assumed that each of the memory cells of the memory device 1100 stores 3 bits of data. The memory cells may have threshold voltage distributions of an erase state (E) and 7 program states (P1~P7).

When each of the memory cells is programmed with 3 bits of data, threshold voltage distributions of 7 program states (P1~P7) is made. After programming, charge loss phenomenon may occur at charge trap layer of the memory cell over time. Thus, the IVS phenomenon may occur, such that the threshold voltage of each of the memory cells is shifted. Each of the threshold voltage distributions (P1~P7) generated immediately after programming may shift to lower threshold voltage program states (P1'~P7'). This IVS phenomenon may occur much more at a program state having a high level threshold voltage. For example, a threshold voltage change degree that the uppermost program state shifts from P7 to P7' is greater than a threshold voltage change degree that the lowermost program state shifts from P1 to P1'.

When the IVS phenomenon of the memory cell has occurred and the threshold voltage of the memory cell is lowered, if the memory system 1000 (reference to FIG. 1) applies the erase voltage without considering the threshold voltage change degree of the memory device 1100, the oxide film degradation of the memory cell may occur faster due to the unnecessary high erase voltage. Furthermore, when performing a deep erase to the memory block, the threshold voltage of the memory cells may be lowered too. Therefore, if programming is performed at the memory cell after the deep erase, the possibility of errors may increase.

If the IVS phenomenon is occurred, the erase control unit 1250 may check the threshold voltage change degree of the memory cells, and change the erase condition. The erase control unit 1250 may improve an oxide film degradation and program error occurrence possibility by applying an optimized erase voltage or erase pulse. As a result, the erase control unit 1250 may prolong lifespan of the memory device 1100.

The erase control unit 1250 may check a threshold voltage change degree of the uppermost program state P7 by performing a pre-read before applying the erase voltage to the memory device 1100. For example, the pre-read operation involving performing a read by applying a specific read voltage to check the threshold voltage change degree of the uppermost program state P7.

The erase control unit 1250 may perform a pre-read by selecting a specific word line of memory block to erase. The selected word line may be a predetermined word line. The selected word line may be a word line programmed last among the memory block. The selected word line may be a word line that has completed multi bit programming first among the memory block.

Referring to the FIG. 7, the specific read voltage may be a pre-read voltage. The pre-read voltage may be lower than a verify voltage of the uppermost program state P7 at programming. The pre-read voltage is higher than a verify voltage of a program state P6 adjacent to the uppermost program state P7. The erase control unit 1250 may check off a cell having a higher threshold voltage than the pre-read voltage based on the read data generated by pre-read result.

FIG. 8 is a table illustrating a method of operating the erase control unit that includes changing an erase operation condition according to some embodiments of the inventive concept.

Referring to the FIG. 8, the erase control unit 1250 may generate an off cell count (OCC) based on a number of the off cells of the selected word line. When the IVS phenomenon has occurred, the uppermost program state memory cells having a lower threshold voltage than the pre-read voltage (Vpr) are increasing, and the off cell count value is lower than a reference value. Thus, the erase control unit 1250 may change the erase operation condition to supply an optimized erase voltage. The erase operation condition may include a level of the erase voltage or a pulse duration of the erase voltage.

For convenience of description, the reference value is 30. Referring to the FIG. 8, if the off cell count (OCC) is greater than or equal to 30, the erase control unit 1250 may not change the erase operation condition because the threshold voltage change of the uppermost program state is small. For example, a level of the erase voltage may be 19V and a pulse duration may be 10 ms.

The erase control unit 1250 may change the erase operation condition if the off cell count (OCC) is less than 30. For example, it is assumed that the off cell count (OCC) of the selected word line is 20. As the off cell count (OCC) is less than the reference value 30, the erase control unit 1250 may change the erase operation condition. The erase control unit 1250 may lower the erase voltage level and/or shorten the erase pulse duration. Referring to the FOG 8, the erase control unit 1250 may lower the erase voltage with 18V, or shorten the pulse duration of the erase voltage to 9 ms.

Figure 9:
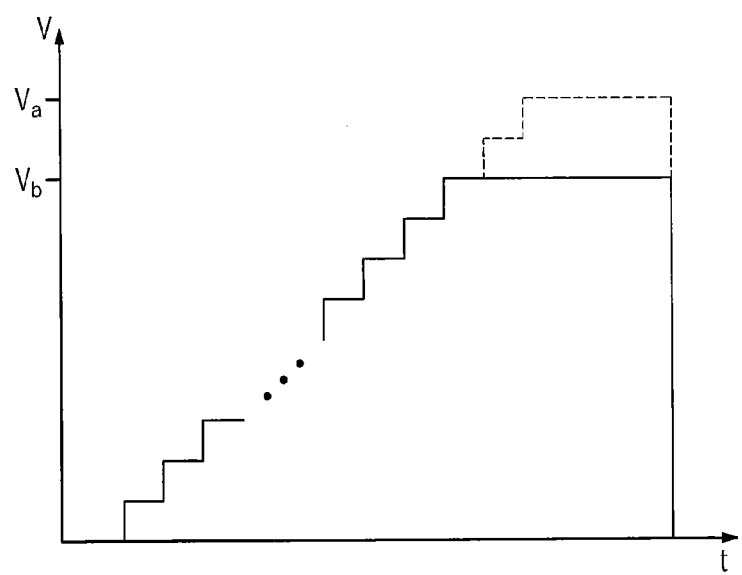
FIG. 9, FIG. 10, and FIG. 11 are graphs illustrating operations in which the erase control unit changes the erase operation condition according to some embodiments of the inventive concept.
Figure 10:
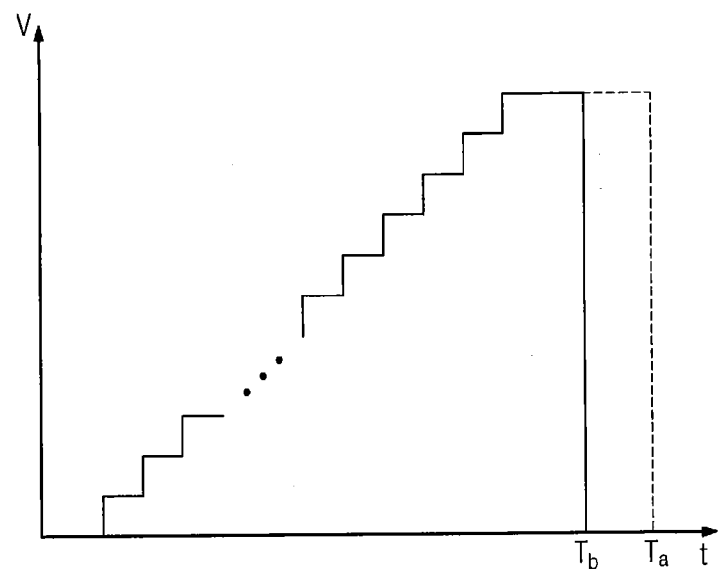
Figure 11:
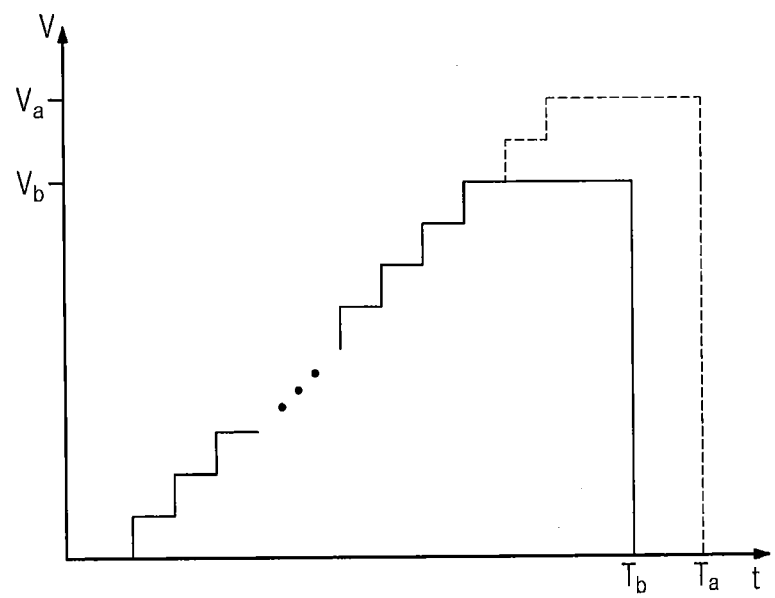

FIG. 9 to FIG. 11 are graphs illustrating operations in which the erase control unit of FIG. 1 changes the erase operation condition according to some embodiments of the inventive concept. In FIG. 9 to FIG. 11, the horizontal axis of the graph is time and the vertical axis of the graph is voltage. In FIG. 9 to FIG. 11, the unbroken line is an erase voltage applied to a memory block including the selected word line when changing the erase operation condition. The broken line is an erase voltage applied to the memory block when not changing the erase operation condition.

Referring to the FIG. 9, when the off cell count (OCC) is less than the reference value, the erase control unit 1250 may lower the erase voltage from Va to Vb. For example, Va may be 19V, and Vb may be 18V. The erase control unit 1250 may perform an erase operation using a relatively low erase voltage if the threshold voltage of the memory cell is lowered. Thus, the oxide film degradation may be reduced.

Referring to the FIG. 10, when the off cell count (OCC) is less than the reference value, the erase control unit 1250 may shorten the pulse duration of erase voltage from $t_a$ to $t_b$. For example, $t_a$ may be 10 ms, and $t_b$ may be 9 ms. The erase control unit 1250 may reduce a time to apply the erase voltage (or erase pulse duration) when erasing a memory block including memory cells. Thus, the erase control unit 1250 may reduce excess time in performing an erase operation.

Referring to the FIG. 11, when the off cell count (OCC) is less than the reference value, the erase control unit 1250 may lower the level of the erase voltage applied to the memory block including selected word line from Va to Vb, and reduce the pulse duration of erase voltage from $t_a$ to $t_b$. The erase control unit 1250 may generate the threshold voltage state of the erased memory cell to a target erase threshold voltage state by lowering the level of the erase voltage, and reducing the pulse duration of erase voltage.

The erase control unit 1250 may perform an erase operation using a relatively low erase voltage if the threshold voltage of the memory cell is lowered. Thus, the oxide film degradation may be reduced. When programming the memory block, the memory device may reduce the programming time and error probability.

Figure 12:
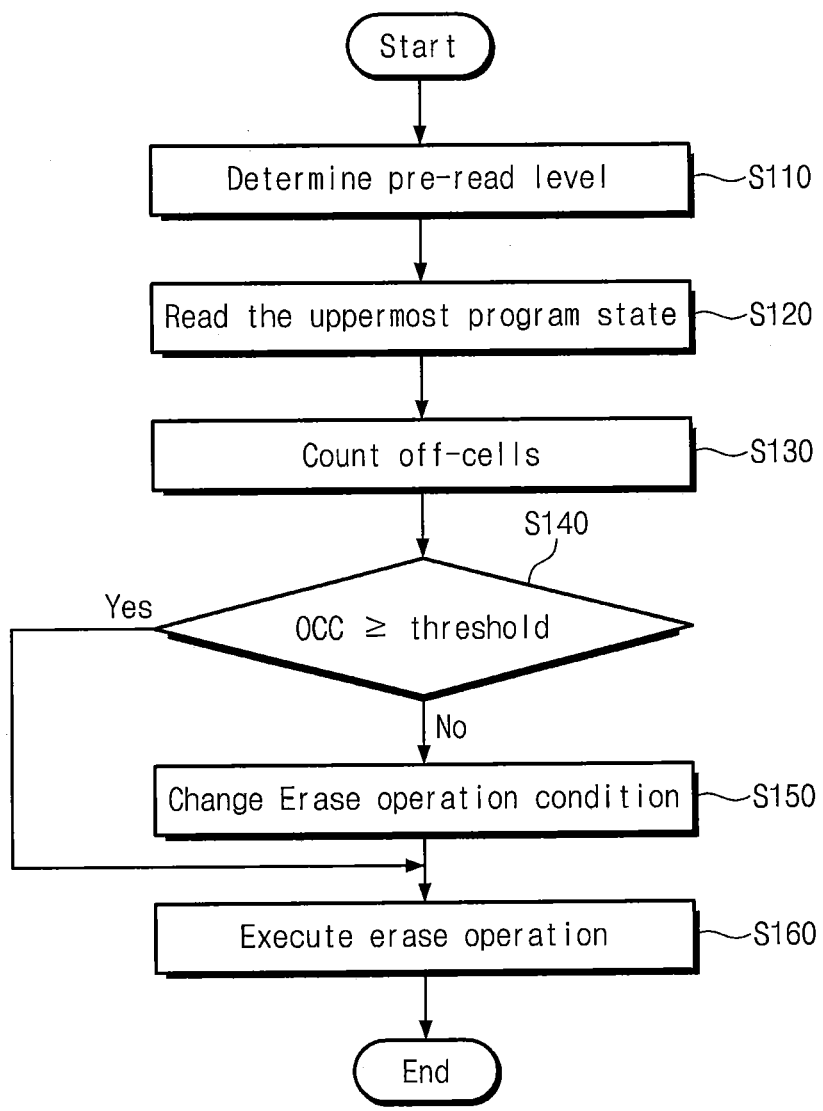
FIG. 12 is a flowchart illustrating operations in which the erase control unit of FIG. 1 changes the erase condition according to some embodiments of the inventive concept.

FIG. 12 is a flowchart illustrating an operation in which the erase control unit 1250 of FIG. 1 changes the erase operation condition according to some embodiments of the inventive concept.

At block S110, the erase control unit 1250 may determine a level of pre-read voltage to perform the pre-read of the selected word line of the memory block. The level of the pre-read voltage may be a predetermined value. The pre-read voltage level may be changed according to the operation environment of the memory device 1100. The memory controller 1200 may change the level of pre-read voltage. The level of pre-read voltage may be stored at the memory device 1100 and/or the memory controller 1200.

At block S120, the erase control unit 1250 may perform a read operation by applying the pre-read voltage to the memory cells connected the selected word line. The pre-read voltage may be a voltage to read the uppermost program state.

At block S130, the erase control unit 1250 may count the number of off cells of the generated read data at block S120. The off cell is a memory cell having a higher threshold voltage than the level of the pre-read voltage determined at block S110. The off cell may be considered to be in a programmed state when performing the read operation by applying pre-read voltage.

At block S140, the erase control unit 1250 may compare the off cell count (OCC) generated at block S130 with the reference value. If the off cell count (OCC) is less than the reference value, the erase control unit 1250 may continue operations at block S150. If the value of off cell count is greater than or equal to the reference value, the erase control unit 1250 may continue operations at block S160.

At block S150, the erase control unit 1250 may change the erase operation condition. If the value of off cell count (OCC) is less than the reference value, the erase control unit 1250 may determine that the threshold voltages of the memory cells are lowered more than a reference range. Thus, the erase control unit 1250 may change the level and/or pulse duration of the erase voltage applied to the memory block. The erase operation condition may include the level and/or pulse duration (a time that the erase voltage is applied to the memory block) of the erase voltage. The erase control unit 1250 may lower the level of the erase voltage. The erase control unit 1250 may reduce a time that the erase voltage is applied to the memory block. The erase control unit may change simultaneously the level and pulse duration of erase voltage.

At block S160, the erase control unit 1250 may erase the memory device to reflect the changed erase operation condition. If the off cell count value is greater than or equal to the reference value, the erase control unit 1250 may determine that the threshold voltages of the memory cells are not shifted or are shifted in the reference range. Thus, the erase control unit 1250 may perform the erase operation without changing the erase operation condition.

Referring to the flow chart of FIG. 12, when erasing, the erase control unit 1250 may perform the pre-read of the selected word line of the memory block, generate the off cell count (OCC) based on the read data, compare the off cell count with the reference value, and erase the memory block with or without changing the erase operation condition according to the comparison result.

FIG. 13 is a table illustrating operations in which the erase control unit 1250 generates an erase class according to some embodiments of the inventive concept.

Referring to the FIG. 13, the erase control unit 1250 may generate an erase class based on the off cell count (OCC) of the selected word line. The erase control unit 1250 may change the erase operation condition based on the erase class. The erase class is generated to supply an optimal erase voltage for each of the erase classes.

For convenience of description, it is assumed that the erase control unit 1250 determines 5 erase classes. If the off cell count of the selected word line is less than or equal to 10, the erase control unit 1250 may determine that an erase class of the memory block including the selected word line is the first erase class according to the pre-read result. For example, when the memory block is in the first erase class, a level of the erase voltage is 17V and/or the erase pulse duration is 8 ms.

If the off cell count (OCC) is greater than 10, and less than or equal to 20, the erase control unit 1250 may determine that the erase class of the memory block is the second erase class. For example, when the erase class of memory block is the second erase class, a level of the erase voltage is 17.5V and/or the erase pulse duration is 8.5 ms.

If the off cell count (OCC) is greater than 20, and less than or equal to 30, the erase control unit 1250 may determine that the erase class of the memory block is the third erase class. For example, when the erase class of memory block is the third erase class, the level of the erase voltage is 18V and/or the erase pulse duration is 9 ms.

If the off cell count (OCC) is greater than 30, and less than or equal to 40, the erase control unit 1250 may determine that the erase class of the memory block is the fourth erase class. For example, when the erase class of memory block is in the fourth erase class, the level of the erase voltage is 18.5V and/or the erase pulse duration is 9.5 ms.

If the off cell count (OCC) is greater than 40, the erase control unit 1250 may determine that the erase class of the memory block is the fifth erase class. For example, when the erase class of memory block is the fifth erase class, the level of the erase voltage is 19V and/or the erase pulse duration is 10 ms.

Referring to the FIG. 13, the erase control unit 1250 may determine that the lower the value of the odd cell count (OCC), the greater the shift degree of the threshold voltage of the memory cells. Thus, if the erase class becomes smaller, the erase voltage level is lowered and/or the erase pulse duration is shortened.

Figure 14:
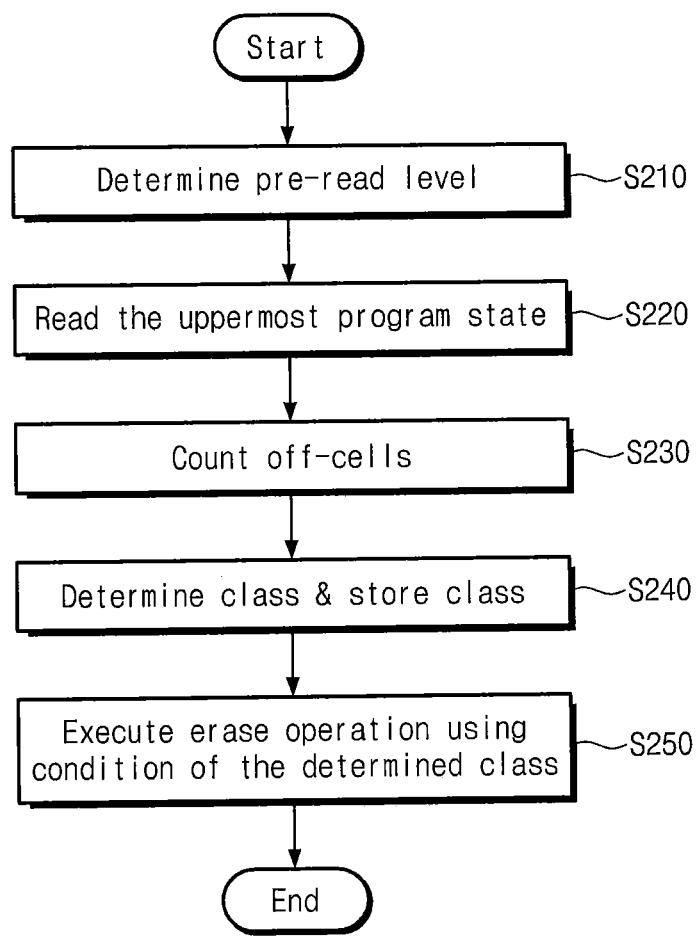
FIG. 14 is a flowchart illustrating operations in which the erase control unit of FIG. 1 generates an erase class and changes an erase operation condition according to some embodiments of the inventive concept.

FIG. 14 is a flow chart illustrating operations in which the erase control unit of FIG. 1 changes the erase operation condition according to some embodiments of the inventive concept.

At block S210, the erase control unit 1250 may determine a level of pre-read voltage to perform the pre-read of the selected word line of the memory block. The pre-read may be performed when the memory device 1100 receives an erase command from the memory controller 1200, and before applying the erase voltage to the memory block. The memory device 1100 may receive the erase command from the memory controller 1200 when the memory device receives a pre-read command from the memory controller, and after the pre-read operation is finished.

At block S220, the erase control unit 1250 may perform a read operation to measure a threshold voltage shift degree of the uppermost program state by applying the pre-read voltage to the selected word line. The uppermost program state experience threshold voltage shift to a greater degree than lower program states. The erase control unit 1250 may generate read data as the read result of the selected word line.

At block S230, the erase control unit 1250 may count the number of off cells of the read data generated at block S220. The erase control unit 1250 may generate the off cell count (OCC) based on the counted number of the off cells.

At block S240, the erase control unit 1250 may determine the erase class of the memory block based on the generated off cell count at block S240. The erase control unit 1250 may store the determined erase class of the memory block to the memory device 1100. The erase control unit 1250 may store the erase class of the memory block to the memory controller 1200.

At block S250, the erase control unit 1250 may change the erase operation condition based on the erase class determined at block S240. The erase control unit 1250 may perform the erase operation of the memory block according to the changed erase operation condition.

Referring to FIG. 14, the erase control unit 1250 may perform a pre-read of the selected word line of the memory block to erase, generate the off cell count based on the read data, determine the erase class based on the off cell count, and perform the erase operation of the memory block by changing the erase operation condition according to the erase class.

Figures 15, 16:
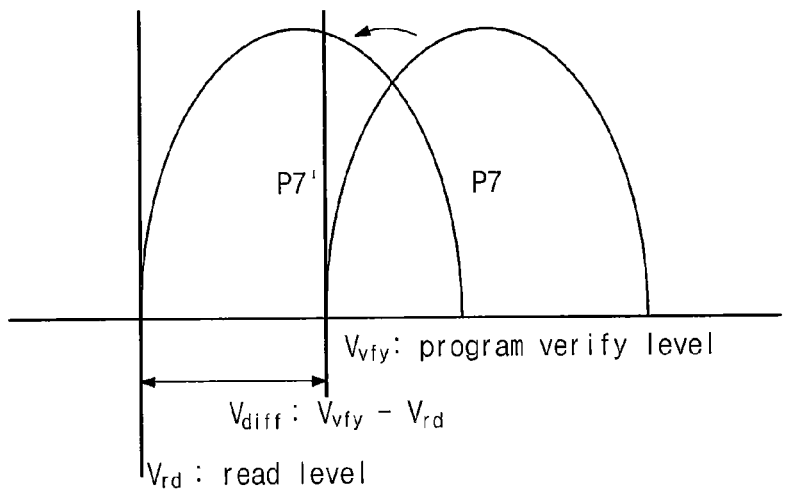
FIG. 15 and FIG. 16 are diagrams illustrating operations in which the erase control unit of FIG. 1 changes the erase operation condition using a read voltage level and a program verify voltage level according to some embodiments of the inventive concept.

FIG. 15, and FIG. 16 are diagrams illustrating operations in which the erase control unit of FIG. 1 changes the erase operation condition using a read voltage level and a program verify voltage level according to some embodiments of the inventive concept.

Referring to FIG. 15, the erase control unit 1250 may check a program verify voltage level ($V_{vfy}$) of the uppermost program state applied to the selected word line at programming. The erase control unit 1250 may check a read voltage level ($V_{rd}$) applied to the selected word line when reading the uppermost program state.

The erase control unit 1250 may calculate a voltage difference between the uppermost program verify voltage ($V_{vfy}$) and the uppermost program state read voltage ($V_{rd}$) of the selected word line. The erase control unit 1250 may change the erase operation condition based on the calculated voltage difference.

The erase control unit 1250 may determine that the more voltage difference, the more the threshold voltage of the uppermost program state has shifted to a lower level. If the uppermost program state of the memory cell shifts to a lower threshold voltage level, the erase control unit 1250 may reduce the oxide film degradation of the memory cell by changing the level and/or pulse duration of the erase voltage applied to the memory block.

Referring to FIG. 16, the erase control unit 1250 may determine the erase class of the memory block based on the voltage difference ($V_{diff}$). For convenience of description, it is assumed that the erase control unit 1250 may define 5 erase classes.

For example, if the voltage difference ($V_{diff}$) is greater than or equal to 500 mV, the erase control unit 1250 may determine that the erase class of the memory block is the first erase class. The level of erase voltage applied to the memory block of the first erase class may be 17V and/or the pulse duration may be 8 ms.

If the voltage difference ($V_{diff}$) is less than 500 mV, and greater than or equal to 400 mV, the erase control unit 1250 may determine that the erase class of memory block is the second erase class. The level of erase voltage applied to the memory block of the second erase class may be 17.5V and/or pulse duration of the erase voltage may be 8.5 ms.

If the voltage difference ($V_{diff}$) is less than 400 mV, and greater than or equal to 300 mV, the erase control unit 1250 may determine that the erase class of memory block is the third erase class. The level of erase voltage applied to the memory block of the third erase class may be 18V and/or pulse duration of the erase voltage may be 9 ms.

If the voltage difference ($V_{diff}$) is less than 300 mV, and greater than or equal to 200 mV, the erase control unit 1250 may determine that the erase class of memory block is the fourth erase class. The level of erase voltage applied to the memory block of the fourth erase class may be 18.5V and/or pulse duration of the erase voltage may be 9.5 ms.

If the voltage difference ($V_{diff}$) is less than 200 mV, the erase control unit 1250 may determine that the erase class of memory block is the fifth erase class. The level of erase voltage applied to the memory block of the fifth erase class may be 19V and/or pulse duration of the erase voltage may be 10 ins.

Referring to FIG. 16, The erase control unit 1250 may determine that the more voltage difference between the verify voltage level ($V_{vfy}$) of the uppermost program state and the read voltage level ($V_{rd}$), the greater the degree of threshold voltage shift of the memory cell. Therefore, if the voltage difference is greater, the level of erase voltage is lower, and/or the erase pulse duration is shorter.

Figure 17:
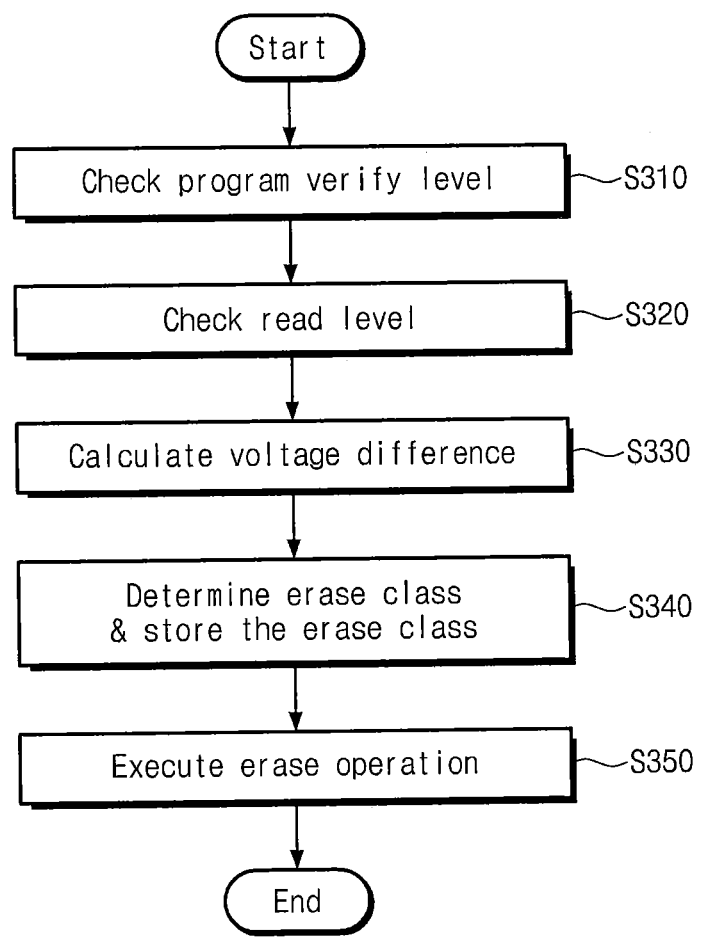
FIG. 17 is a flowchart illustrating operations in which the erase control unit of FIG. 1 generates the erase class according to a voltage difference, and changes the erase operation condition according to some embodiments of the inventive concept.

FIG. 17 is a flowchart illustrating operations in which the erase control unit 1250 of FIG. 1 generates the erase operation, and changes the erase operation condition according to the voltage difference according to some embodiments of the inventive concept.

At block S310, the erase control unit 1250 may check the program verify voltage level of the uppermost program state of the selected word line of the memory block. The erase control unit 1250 may check the program verify voltage level when the memory device 1100 receives the erase command from the memory controller 1200, and before the erase voltage is applied to the memory block. The memory control 1200 may transmit the erase command to the memory device 1100 after a program verify voltage checking command to the memory device 1100.

At block S320, the erase control unit 1250 may check the level of the read voltage to read the uppermost program state of the selected word line. The level of the read voltage may be stored at the memory controller 1200 or the memory device 1100 when read is performed to the selected word line of the memory device 1100.

At block S330, the erase control unit 1250 may calculate the voltage difference ($V_{diff}$) between the verify voltage level and the read voltage level of the uppermost program state of the selected word line.

At block S340, the erase control unit 1250 may determine the erase class based in the voltage difference ($V_{diff}$) generated at block S330. The erase control unit 1250 may save the erase class of the memory block on the memory device 1100 and/or the memory controller 1200.

At block S350, the erase control unit 1250 may change the erase operation condition based on the erase class determined at block S340. The erase control unit 1250 may erase the memory block according to the erase operation condition.

Referring to the FIG. 17, the erase control unit 1250 may generate the voltage difference based on the verify voltage level and the read voltage level of the uppermost program state of the memory block to erase, determine the erase class based on the voltage difference, and erase the memory block by changing the erase operation condition according to the erase class.

Figures 18, 19:
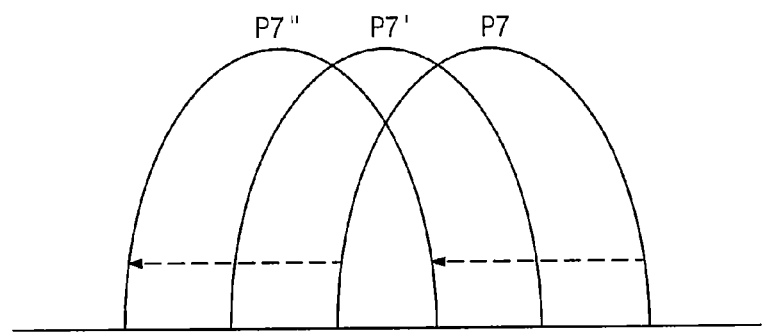
FIG. 18 and FIG. 19 are diagrams illustrating operations in which the erase control unit of FIG. 1 generates the erase class according to the retention time and changes the erase condition according to some embodiments of the inventive concept.

FIG. 18 and FIG. 19 are diagrams illustrating operations in which the erase control unit 1250 of FIG. 1 changes the erase operation condition using a data retention time according to some embodiments of the inventive concept.

Referring to FIG. 18, the memory cells may experience changes to the threshold voltage due to the IVS phenomenon by rearranging electron/hole charges stored at charge trap layer of the memory cell as time passes after programming. A time to maintain data without erasing after programming of the memory block is referred as retention time (RT).

The retention time (RT) may be calculated as a time difference between a program finish time of the selected word line included in the memory block to erase and a current time. If the retention time is longer, the threshold voltage of the memory cell may be lowered. For example, the threshold voltage distribution of the uppermost program state generated by programming is P7. If the retention time of the memory cell becomes longer, the threshold voltage distribution may shift from P7 to P7', and from P7' to P7".

The erase control unit 1250 may determine that if the retention time becomes longer, the threshold voltage of the uppermost program state becomes lower. If the threshold voltage of the uppermost program state of the memory cell becomes lower, the erase control unit 1250 may change the erase voltage level and/or pulse duration. Therefore, the erase control unit 1250 may reduce the degradation of oxide film and charge trap layer of the memory cell.

Referring to FIG. 19, the erase control unit 1250 may check a retention time of the selected word line of the memory block. The selected word line may be a word line that has completed a multi-bit programming operation of the memory block. The selected word line may be a predetermined word line. The retention time of the selected word line may be stored on the memory controller 1200 or the memory device 1100.

The erase control unit 1250 may determine the erase class of the memory block based on the retention time. For convenience of description, it is assumed that the erase control unit 1250 may define 5 erase classes. The levels of the erase voltage and/or the pulse durations applied to the first erase class to the fifth erase class are similar to those of FIG. 16, thus repeated description will be omitted.

For example, if the retention time is greater than or equal to 30000s (second), the erase control unit 1250 may determine that the erase class of the memory block is the first erase class. If the retention time is less than 30000S, and greater than and equal to 2500s, the erase control unit 1250 may determine that the erase class of the memory block is the second erase class.

For example, if the retention time of the erase control unit 1250 is less than 2500S, and greater than or equal to 2000s, the erase control unit 1250 may determine that the erase class of the memory block is the third erase class. If the retention time is less than 2000s, and greater than and equal to 1500s, the erase control unit 1250 may determine that the erase class of the memory block is the fourth erase class. If the retention time is less than 1500s, the erase control unit 1250 may determine that the erase class of the memory block is the fifth erase class.

Referring to FIG. 19, the erase control unit 1250 may determine that if the retention time (RT) of a memory cell becomes longer, the greater the degree of shift in the threshold voltage of the memory cell. Therefore, the longer retention time, the level of erase voltage is lowered, and/or the erase pulse duration is shortened.

Figure 20:
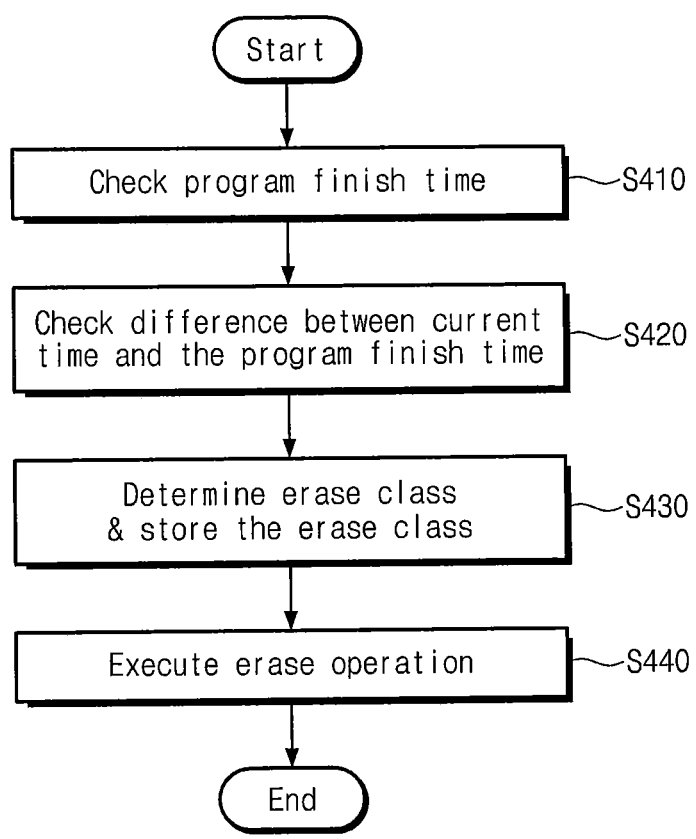
FIG. 20 is a flowchart illustrating operations in which the erase control unit of FIG. 1 generates an erase class according to the retention time and changes the erase condition according to some embodiments of the inventive concept.

FIG. 20 is a flowchart illustrating operations in which the erase control unit of FIG. 1 generates the erase class according to the retention time and changes the erase operation condition according to some embodiments of the inventive concept.

At block S410, the erase control unit 1250 may check the program finish time of the selected word line. The selected word line may be included in the memory block to erase. The program finish time may be stored at the memory controller 1200 and/or the memory device 1100.

At block S420, the erase control unit 1250 may calculate a time difference between the program finish time of the selected word line and the current time, and generate the retention time of the selected word line.

In step S430, the erase control unit 1250 may determine the erase class of the memory block based on the retention time of the selected word line generated at block S420. The erase control unit 1250 may store the determined erase class of the memory block at the memory controller 1200 or memory device 1100.

At block S440, the erase control unit 1250 may change the erase operation condition based on the erase class determined at block S430. The erase control unit 1250 may erase the memory block according to the changed erase operation condition.

Referring to FIG. 20, the erase control unit 1250 may generate the retention time based on the program finish time of the uppermost program state of the memory block to erase, determine the erase class based on the retention time, and erase the memory block by changing the erase operation condition according to the erase class.

Figures 21, 22:
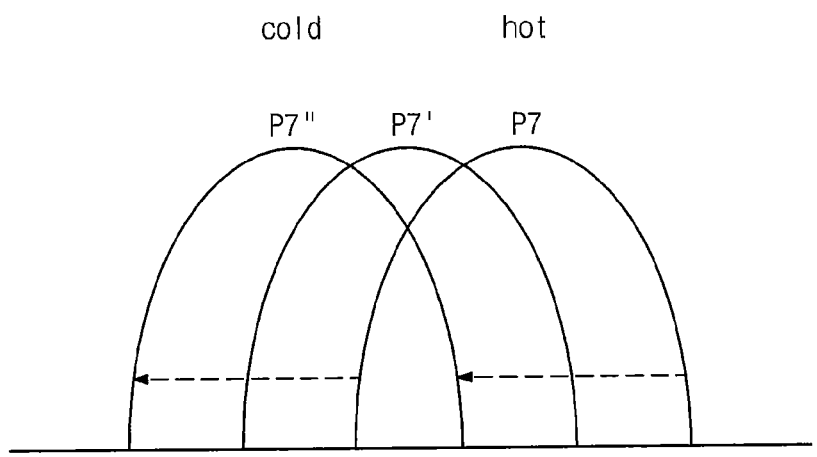
FIG. 21 and FIG. 22 are diagrams illustrating operations in which the erase control unit of FIG. 1 changes the erase condition according to a temperature of the memory device according to some embodiments of the inventive concept.

FIG. 21 and FIG. 22 are diagrams that illustrate operations in which the erase control unit of FIG. 1 changes the erase operation condition according to a temperature of the memory device according to some embodiments of the inventive concept.

Referring to FIG. 21, the threshold voltages of memory cells may change according to the temperature of the memory device 1100. For convenience of description, when programming is performed of the selected word line of the memory block, it is assumed that the temperature of the memory device 1100 is about 75° C. When the programming is completed at the selected word line of the memory block, the uppermost program state is P7. After programming, and when reading or erasing is performed, if the temperature of the memory device is about 50° C., the threshold voltage of the uppermost program state of the selected word line may be changed to P7'.

The erase control unit 1250 may determine that the greater the temperature difference ($T_{diff}$) between the temperature during programming and the temperature during an erase operation, the threshold voltage of the uppermost program state of the memory cell is lowered. If the threshold voltage of the uppermost program state is lowered, the erase control unit 1250 may reduce the oxide film degradation by changing the level of erase voltage applied to the memory block and/or the pulse duration.

Referring to FIG. 22, the erase control unit 1250 may check the temperature difference ($T_{diff}$) of the memory device at programming and at present. The temperature difference ($T_{diff}$) is a difference between a memory device temperature value when the selected word line is programmed, and a current memory device temperature value. The erase control unit 1250 may determine the temperature difference associated with a selected word line. The selected word line may be a predetermined word line. The temperature difference ($T_{diff}$) of a selected word line may be stored at the memory controller 1200 and/or the memory device 1100.

Continuing referring to FIG. 22, the erase control unit 1250 may determine the erase class of the memory block based on the temperature difference ($T_{diff}$). For convenience of description, the erase control unit 1250 may define 5 erase classes. Levels and pulse durations of the erase voltages of the first to the fifth erase classes are similar to those of FIG. 16, and repeated description will be omitted.

For example, if the temperature difference is greater than or equal to 50° C., the erase control unit 1250 may determine that the erase class of the memory block is the first erase class. If the temperature difference is less than 50° C., and greater than or equal to 40° C., the erase control unit 1250 may determine that the erase class of the memory block is the second erase class.

For example, If the temperature difference is less than 40° C., and greater than or equal to 30° C., the erase control unit 1250 may determine that the erase class of the memory block is the third erase class. If the temperature difference is less than 30° C., and greater than or equal to 20° C., the erase control unit 1250 may determine that the erase class of the memory block is the fourth erase class. If the temperature difference is less than 20° C., the erase control unit 1250 may determine that the erase class of the memory block is the fifth erase class.

Referring to FIG. 22, the erase control unit may determine that the greater the temperature difference of a memory cell, the greater the degree of shift of the threshold voltage. Thus, the more temperature difference, the erase voltage level is lowered, and/or the erase pulse duration is shortened.

Figure 23:
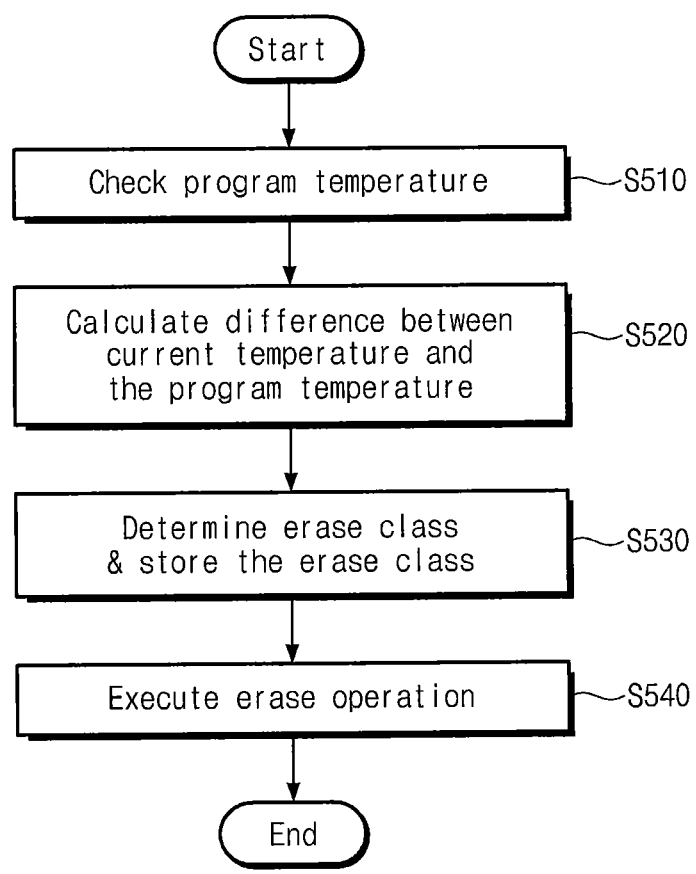
FIG. 23 is a flowchart illustrating operations in which the erase control unit of FIG. 1 generates the erase class according to a temperature difference, and changes the erase condition according to some embodiments of the inventive concept.

FIG. 23 is a flow chart illustrating operations in which the erase control unit of FIG. 1 generates the erase class according to the temperature difference, and changes the erase operation condition according to some embodiments of the inventive concept.

At block S510, the erase control unit 1250 may check a program temperature of the selected word line. The program temperature may be stored at the memory controller 1200 or the memory device 1100.

At block S520, the erase control unit 1250 may generate the temperature difference ($T_{diff}$) by calculating the difference between the program temperature and the current temperature of the selected word line.

At block S530, the erase control unit 1250 may determine the erase class of memory block based on the temperature difference of the selected word line generated at block S520. The erase control unit 1250 may store the determined erase class of the memory block at the memory controller 1200 and/or the memory device 1100.

At block S540, the erase control unit 1250 may change the erase operation condition based on the erase class determined at block S530. The erase control unit 1250 may erase the memory block according to the changed erase operation condition.

Referring to FIG. 23, the erase control unit 1250 may generate the temperature difference based on the program temperature of the selected word line included in the memory block to erase, determine the erase class based on the temperature difference, and perform an erase operation by changing the erase operation condition according to the erase class.

Figure 24:
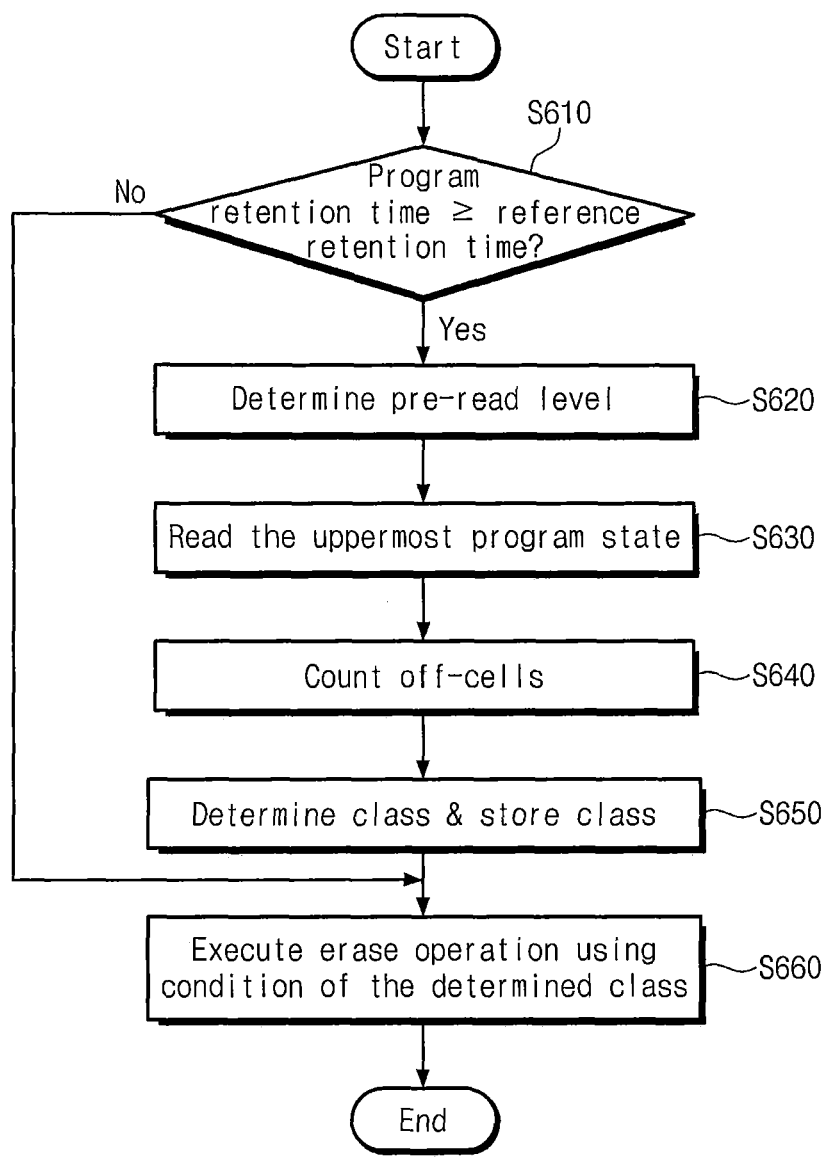
FIG. 24 is a flowchart illustrating operations in which the erase control unit of FIG. 1 generates the erase class using the retention time and off cell count and changes the erase operation condition according to some embodiments of the inventive concept.

FIG. 24 is a flowchart illustrating operations in which the erase control unit of FIG. 1 generates the erase class using the retention time and off cell count and changes the erase operation condition according to some embodiments of the inventive concept.

At block S610, the erase control unit 1250 may check whether the retention time of the memory block is longer than or equal to the reference retention time. The retention time may be an average retention time of the memory block to erase. The retention time may be a retention time of the selected word line. If the retention time is longer than or equal to the reference retention time, the erase control unit 1250 may continue operations at block S620. If the retention time is shorter than the reference retention time, the erase control unit 1250 may continue operations at block S660.

At block S620, the erase control unit 1250 may determine the pre-read voltage level to perform the pre-read to the selected word line. The level of the pre-read voltage may be a predetermined voltage level. The level of the pre-read voltage may be changed according to the operation condition of the memory device.

At block S630, the erase control unit 1250 may perform a pre-read operation by applying the pre-read voltage to the selected word line to measure the threshold voltage shift of the uppermost program state. The erase control unit 1250 may generate read data based on the read result.

At block S640, the erase control unit 1250 may generate the off cell count by counting the number of off cells of the read data generated at block S630.

At block S650, the erase control unit 1250 may determine the erase class based on the off cell count generated in step S640. The erase control unit 1250 may store the determined erase class of the memory block at the memory device 1100. The erase control unit 1250 may store the erase class of the memory block at the memory controller 1200.

At block S660, the erase control unit 1250 may change the erase operation condition based on the erase class determined at block S650. The erase control unit 1250 may erase the memory block according to the changed erase operation condition. At block S610, if the retention time of the memory block is shorter than the reference retention time, the erase control unit 1250 may erase the memory block according to a basic erase operation condition without changing the erase operation condition.

Referring to the FIG. 24, the erase control unit 1250 may compare the retention time of the memory block to erase with the reference retention time, perform the pre-read of the selected word line according to the comparison result, generate the off cell count based on the read data, determine the erase class based on the off cell count, and erase the memory block according to the erase class by changing the erase operation condition.

Figure 25:
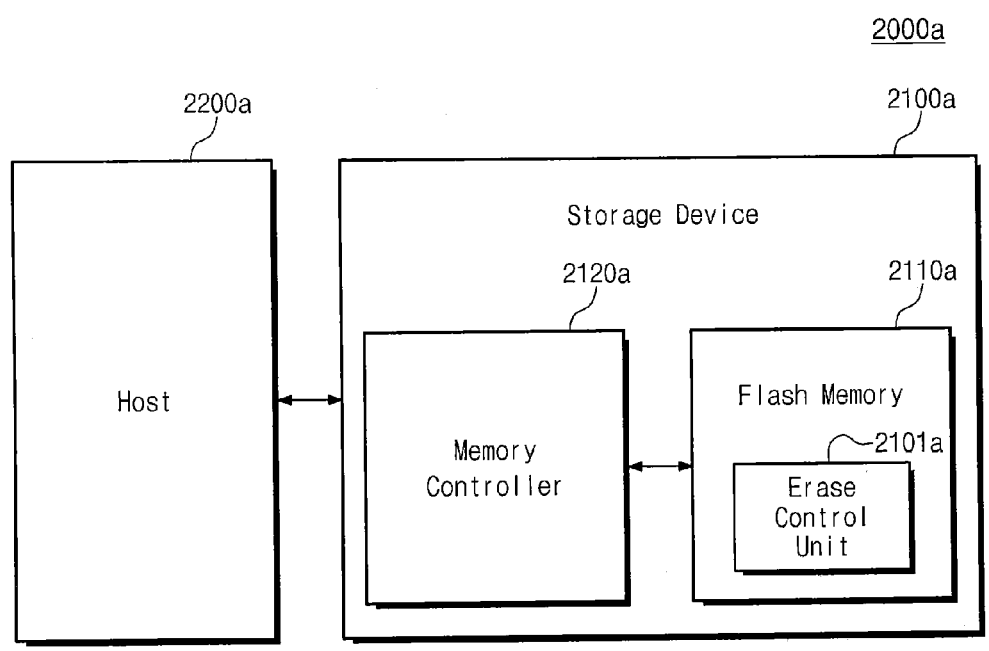
FIG. 25 and FIG. 26 are block diagrams respectively illustrating applications that may incorporate a memory system according to some embodiments of the inventive concept.
Figure 26:
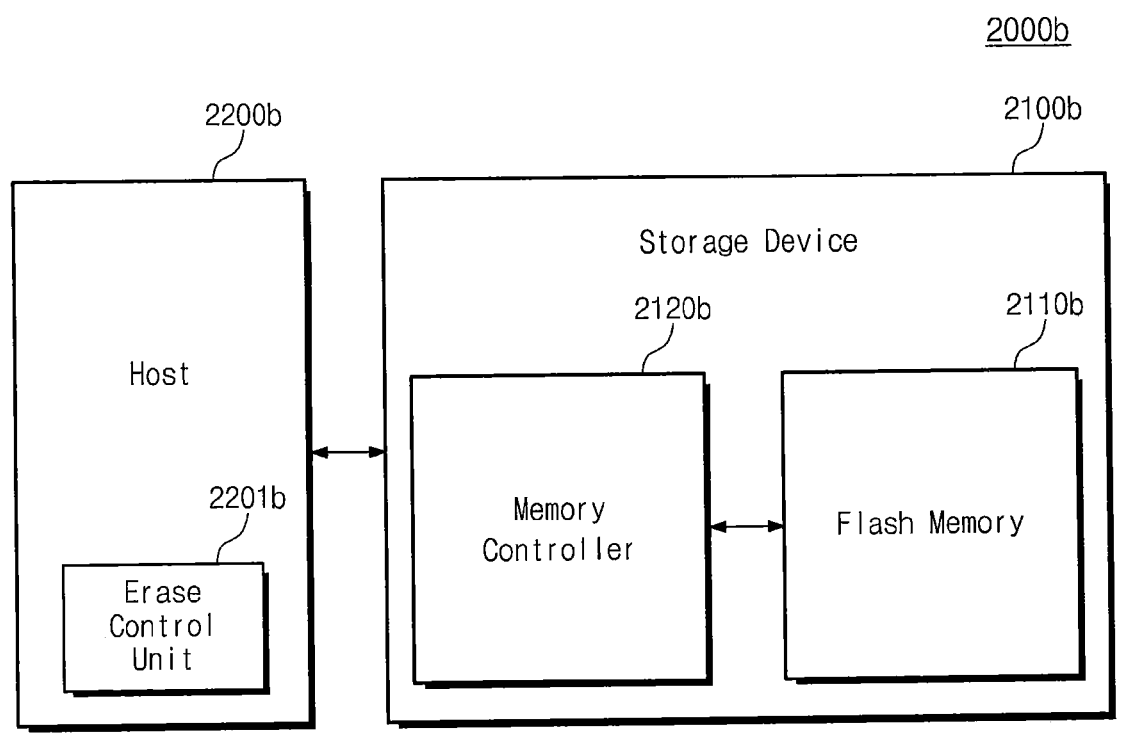

FIG. 25 and FIG. 26 are block diagrams respectively illustrating applications that may incorporate a memory system according to some embodiments of the inventive concept. Referring to FIGS. 25 and 26, a memory system 2000a, 2000b comprises a storage device 2100a, 2100b, and a host 2200a, 2200b. The storage device 2100a, 2100b may include a flash memory 2100a, 2100b and a memory controller 2120a, 2120b.

The storage device 2100a, 2100b may include a storage medium, such as a memory card (e.g., SD, MMC, etc.) or an attachable handheld storage device (e.g., an USB memory). The storage device 2100a, 2100b may be connected with the host 2200a, 2200b. The storage device 2100a, 2100b may transmit and receive data to and from the host via a host interface. The storage device 2100a, 210013 may be supplied with a power from the host 2200a, 2200b.

Referring to FIG. 25, an erase control unit 2101a may be included in a flash memory 2110a, and referring to FIG. 26, an erase control unit 2201b may be included in a host 2200b. Memory systems 2000a, 2000b according to embodiments of the inventive concept may improve oxide degradation associated with the IVS phenomenon and extend the lifespan of memory device by improving the erase operation condition using the erase control unit 2101a, 2201b.

Figure 27:
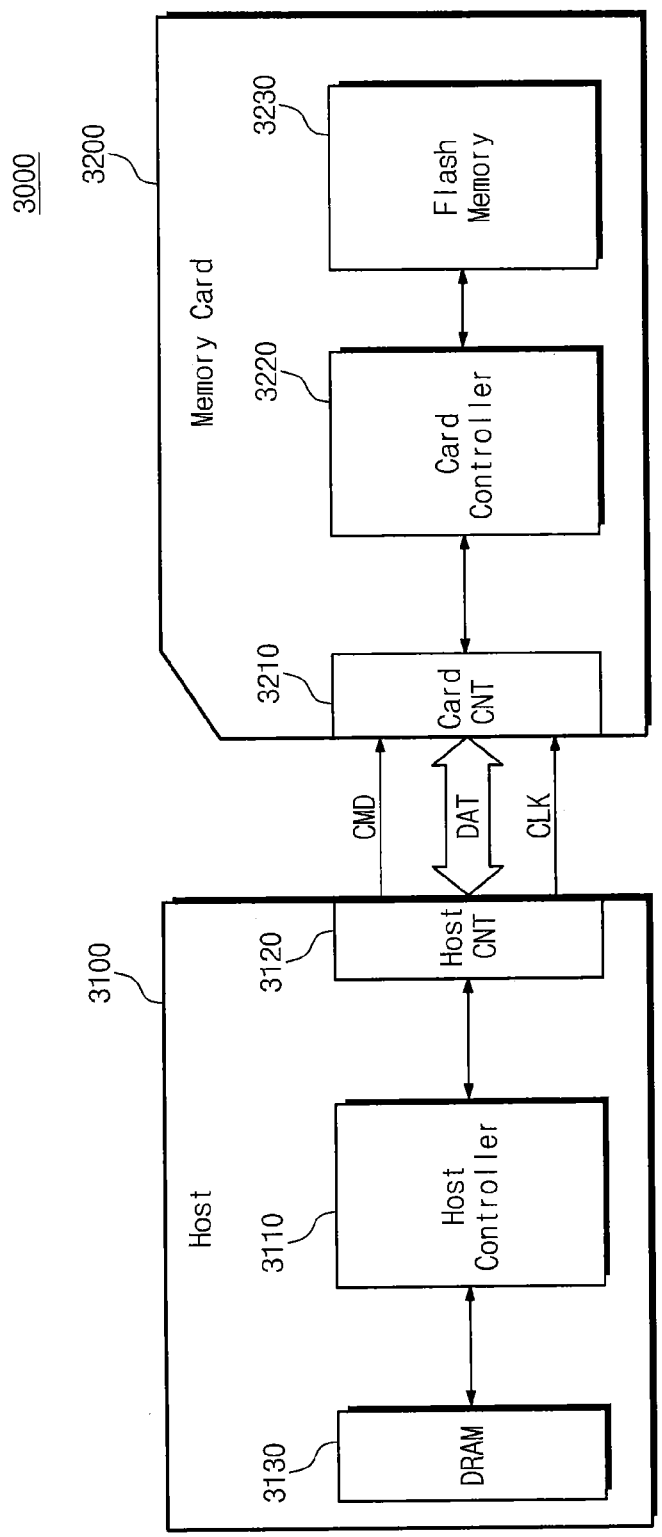
FIG. 27 is a block diagram illustrating a memory card system that may incorporate a memory system according to some embodiments of the inventive concept.

FIG. 27 is a block diagram illustrating a memory card system 3000 that may incorporate a memory system according to some embodiments of the inventive concept. The memory card system 3000 includes a host 3100 and a memory card 3200. The host 3100 includes a host controller 3110, a host connection unit 3120, and DRAM 3130.

The host 3100 may write data in the memory card 3200 and read data from the memory card 3200. The host controller 3100 may send a command (e.g., a write command), a clock signal CLK generated by a clock generator (not shown), and corresponding write data to the memory card 3200 via the host connection unit 3120. The DRAM 3130 may be used as a main memory by the host 3100.

The memory card 3200 may include a card connection unit 3210, a card controller 3220, and a flash memory 3230. The card controller 3220 may store data in the flash memory 3230 in response to a command input via the card connection unit 3210. The data may be stored synchronously with respect to the clock signal generated by a clock generator (not shown) in the card controller 3220. The flash memory 3230 may store data transferred from the host 3100. For example, in a case where the host 3100 is a digital camera, the flash memory 3230 may store image data.

A memory card system 3000 illustrated in FIG. 27 may include an erase control unit in the host controller 3100, card controller 3220, or the flash memory 3230. As described above, embodiments of the inventive concept including the use of a erase control unit may improve oxide degradation associated with the IVS phenomenon and extend the lifespan of flash memory 3230 by improving the erase operation condition using the erase control unit.

Figure 28:
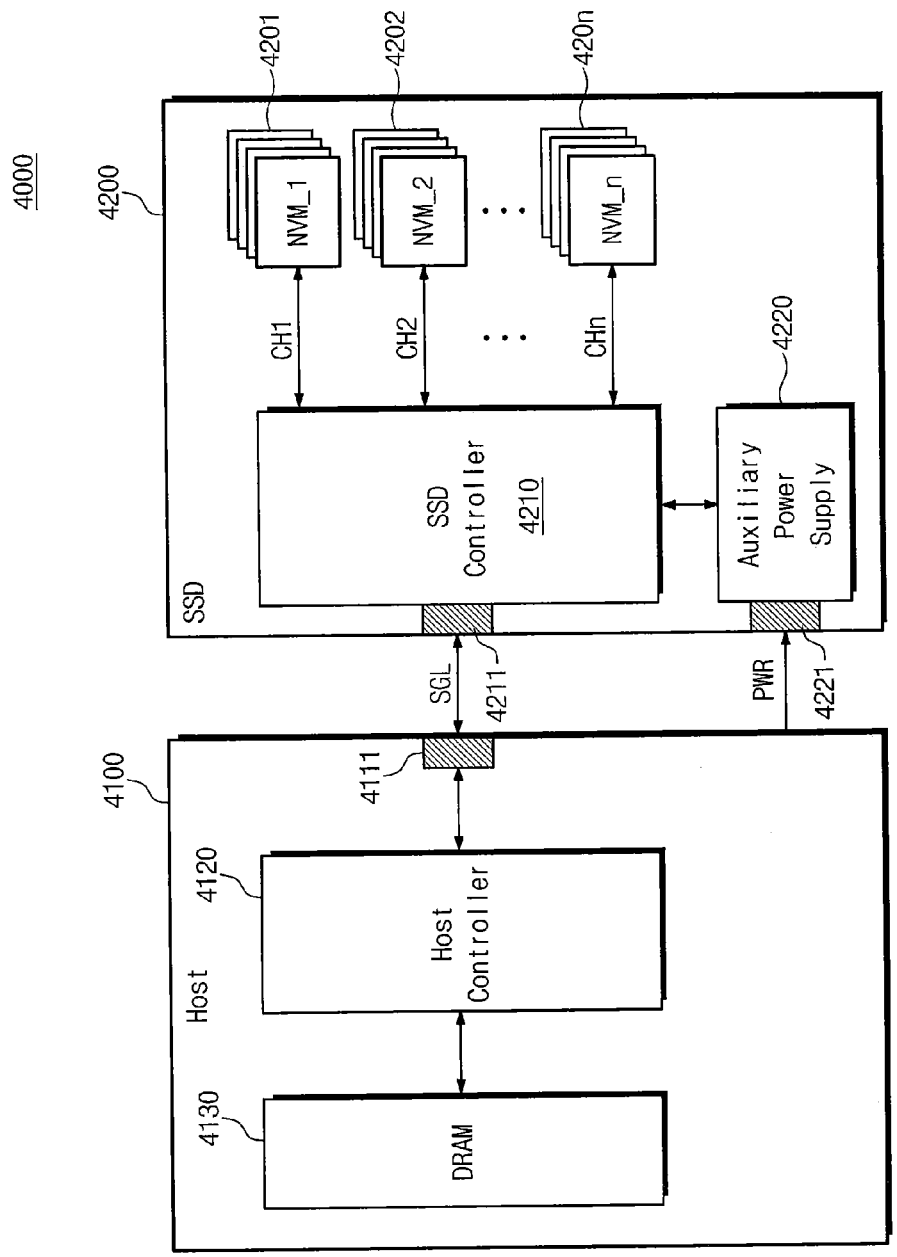
FIG. 28 is a block diagram illustrating a solid state drive (SSD) system including a memory system according to some embodiments of the inventive concept.

FIG. 28 is a block diagram illustrating a solid state drive (SSD) system including a memory system according to some embodiments of the inventive concept. Referring to FIG. 28, a SSD system 4000 generally includes a host 4100, and an SSD 4200. The host 4100 includes a host interface 4111, a host controller 4120, and a DRAM 4130.

The host 4100 may be used to write data to the SSD 4200, and to read data from the SSD 4200. The host controller 4120 may be used to transfer signals (SGL), such as command(s), address(es), and/or control signal(s) to the SSD 4200 via the host interface 4111. The DRAM 4130 may be used to as main memory of the host 4100.

The SSD 4200 may be configured to exchange SGL signals with the host 4100 via the host interface 4211, and may also be configured to receive power via a power connector 4221. The SSD 4200 includes a plurality if nonvolatile memories 4201 to 420$n$, an SSD controller 4210, and an auxiliary power supply 4220. Herein, the nonvolatile memories 4201 to 420$n$ may be implemented using not only one or more flash memory devices, but also PRAM, MRAM, ReRAM, etc.

The plurality of nonvolatile memories 4201 to 420$n$ may be used as the storage medium of SSD 4200. The plurality of nonvolatile memories 4201 to 420$n$ may be connected with the SSD controller 4210 via a plurality of channels, CH1 to CHn. One channel may be connected with one or more nonvolatile memories. Nonvolatile memories connected with one channel may be connected with the same data bus.

The SSD controller 4210 may exchange signals SGL with the host 4100 via the host interface 4211. Herein, the signals SGL may include a command, an address, data, and the like. The SSD controller 4210 may be configured to write or read out data to or from a corresponding nonvolatile memory according to a command of the host 4100. The SSD controller 4210 will be more fully described with reference to FIG. 29.

The auxiliary power supply 4220 may be connected with the host 4100 via the power connector 4221. The auxiliary power supply 4220 may be changed by a power PWR from the host 4100. The auxiliary power supply 4220 may be placed within the SSD 4200 or outside the SSD. For example, the auxiliary power supply 4220 may be disposed on a main board to supply an auxiliary power to the SSD 4200.

Figure 29:
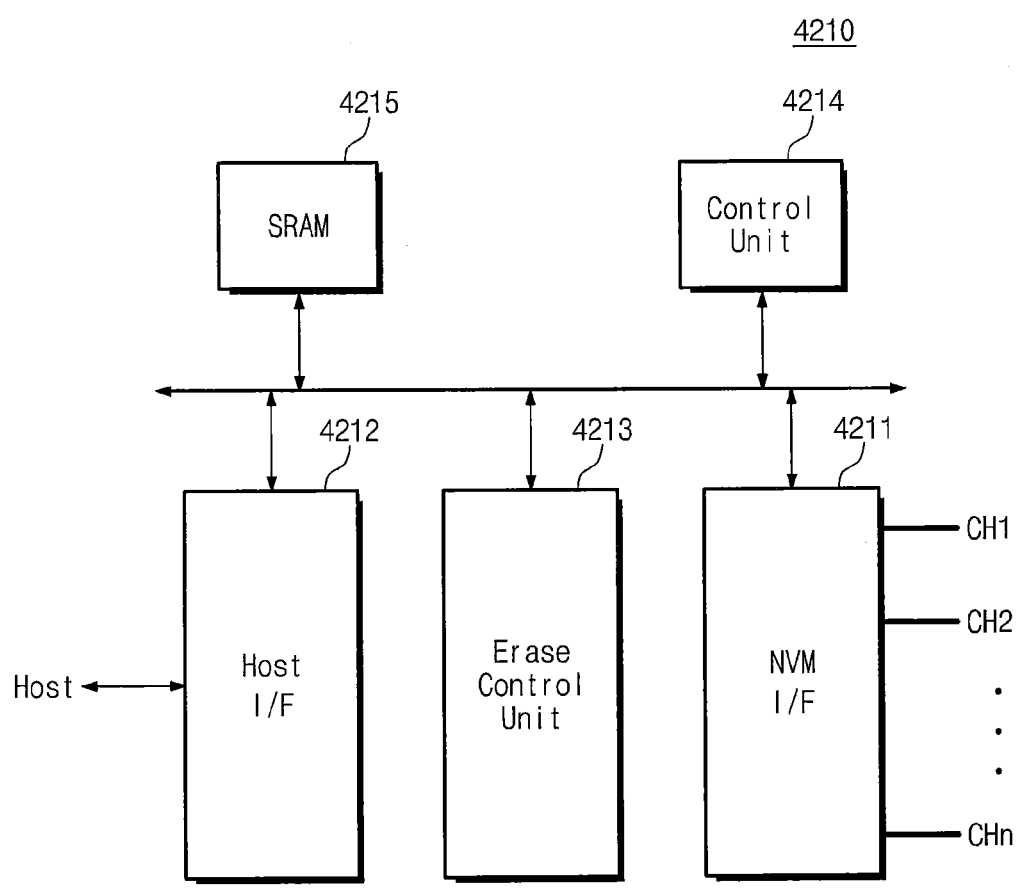
FIG. 29 is a block diagram further illustrating the SSD controller of FIG. 28.

FIG. 29 is a block diagram further illustrating the SSD controller 4210 of FIG. 28. Referring to FIG. 29, the SSD controller 4210 comprises an NVM interface 4211, a host interface 4212, a migration manager 4213, control unit 4214, and an SRAM 4215.

The NVM interface 4211 may scatter data transferred from a main memory of a host 4100 to channels CH1 to CHn, respectively. The NVM interface 4211 may transfer data read from nonvolatile memories 4201 to 420$n$ to the host 4100 via the host interface 4212.

The host interface 4212 may provide an interface with an SSD 4200 according to the protocol of the host 4100. The host interface 4212 may communicate with the host 4100 using USB, SCSI, PCI, PCI-E, ATA, parallel ATA, serial ATA, SAS, etc. The host interface 4212 may perform a disk emulation function which, enables the host 4100 to recognize the SSD 4200 as a hard disk drive (HDD).

The erase control unit 4213 may be used to manage the execution of an erase operation in relation to the nonvolatile memories 4201 to 420$n$, as described above. The control unit 4214 may be used to analyze and process signals SGL input from the host 4100. The control unit 4214 may be used to control the host 4100 via the host interface 4212 or the nonvolatile memories 4201 to 420$n$ via the NVM interface 4211. The control unit 4214 may control the nonvolatile memories 4201 to 420$n$ using firmware that drives at least in part the operation of SSD 4200.

The SRAM 4215 may be used to drive software, which efficiently manages the nonvolatile memories 4201 to 420$n$. The SRAM 4215 may store metadata input from a main memory of the host 4100 or cache data. At a sudden power-off operation, metadata or cache data stored in the SRAM 4215 may be stored in the nonvolatile memories 42201 to 420$n$ using an auxiliary power supply 4220.

Returning to FIG. 29, the SSD system 4000 incorporating techniques consistent with the inventive concept may improve oxide degradation associated with the IVS phenomenon and extend the lifespan of memory device by improving the erase operation condition using the erase control unit of the memory system as described above.

Figure 30:
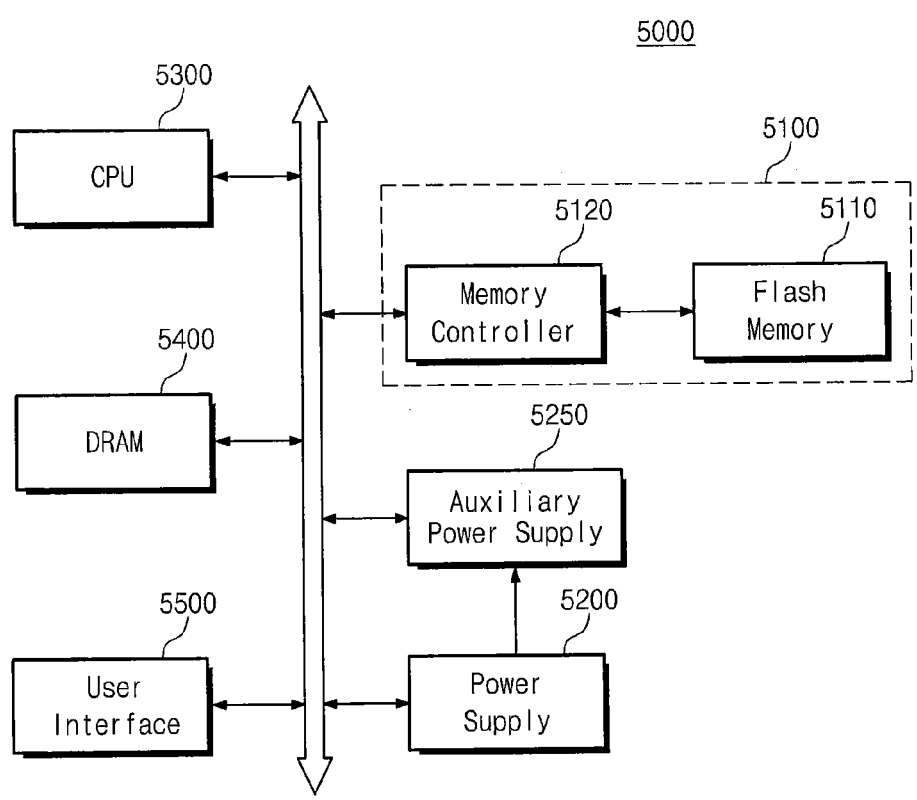
FIG. 30 is a block diagram illustrating an electronic device that may incorporate a memory system according to some embodiments of the inventive concept.

FIG. 30 is a block diagram illustrating an electronic device that may incorporate a memory system according to an embodiment of the inventive concept. Herein, an electronic device 5000 may be a personal computer (PC) handheld electronic device such as a notebook computer, a cellular phone, a personal digital assistant (PDA), a digital camera, etc.

Referring to FIG. 30, the electronic device 5000 generally comprises a memory system 5100, a power supply device 5200, an auxiliary power supply 5250, a central processing unit (CPU) 5300, a DRAM 5400, and a user interface 5500. The memory system 5100 may be embedded within the electronic device 5000.

As described above, by incorporating a memory system according to an embodiment of the inventive concept, the electronic device 5000 may improve oxide degradation associated with the IVS phenomenon and extend the lifespan of memory device by improving the erase operation condition using the erase control unit.

The above-disclosed subject matter is to be considered illustrative in nature, and the scope of the following claims extends over many modifications and enhancements that will become apparent to those of ordinary skill in the art upon consideration of the foregoing. Thus, to the maximum extent allowed by law, the scope of the claims shall be determined by the broadest permissible interpretation, and shall not be restricted or limited to only the foregoing illustrated embodiments.

What is claimed is:

1. A method of operating a memory system including a nonvolatile memory including a memory block, and a memory controller including an erase control unit, the method comprising:
performing pre-reading of a plurality of memory cells connected to a selected word line of the memory block;
generating an off cell count based on the pre-reading result;
by operation of the erase control unit, comparing the off cell count with a reference value to generate a comparison result, and changing an erase operation condition based on the comparison result;
by operation of the nonvolatile memory, erasing the memory block according to the changed erase operation condition.

2. The method of claim 1, wherein the nonvolatile memory comprises a three dimensional flash memory cell array,
wherein the performing pre-reading of the plurality of memory cells comprises:
reading by applying a pre-read voltage to the selected word line,
wherein a level of the pre-read voltage is lower than a level of a verify voltage of an uppermost program state, and higher than a level of a read voltage of the uppermost program state.

3. The method of claim 2, wherein the off cell count is a number of memory cells which have threshold voltages higher than or equal to the pre-read voltage among the pre-reading result, and
wherein the reference value is based on an operating environment of the memory system.

4. The method of claim 2, wherein the changing the erase operation condition is performed upon determining that the off cell count is smaller than the reference value, and the erasing is performed without the changing the erase operation condition upon determining that the off cell count is larger than or equal to the reference value.

5. The method of claim 2, wherein the changing the erase operation condition is lowering an erase voltage level below a reference erase voltage level.

6. The method of claim 2, wherein the changing the erase operation condition is shortening an erase voltage pulse to be shorter than a reference erase voltage pulse.

7. The method of claim 2, wherein the memory controller comprises a Random Access Memory (RAM) or a Read Only Memory (ROM) configured to store a value of the off cell count and the changed erase operation condition.

8. A method of operating a memory system including a nonvolatile memory including a memory block, and a memory controller including an erase control unit, the method comprising:
generating read data by applying a first read voltage to a word line of the memory block;
generating an off cell count based on the read data;
by operation of the erase control unit, determining an erase class among a plurality of erase classes based on the off cell count;
determining an erase operation condition according to the determined erase class;
by operation of the nonvolatile memory, erasing the memory block based on the determined erase operation condition.

9. The method of claim 8, wherein the off cell count is a number of memory cells which have threshold voltages higher than the first read voltage,
wherein a level of the first read voltage is lower than a program verify voltage level of a first program state, and higher than a program verify voltage level of a second program state,
wherein the first program state is an uppermost program state, the second program state is a lower program state adjacent to the uppermost program state.

10. The method of claim 9, wherein the plurality of the erase classes comprises at least three erase classes,
if the off cell count is less than or equal to a first reference value, the erase class of the memory block is a first erase class,
if the off cell count is greater than the first reference value, and less than or equal to a second reference value, the erase class of the memory block is a second erase class,
if the off cell count is greater than the second reference value, the erase class of the memory block is a third erase class.

11. The method of claim 10, wherein the first erase class is configured to provide a first erase voltage, the second erase class is configured to provide a second erase voltage, the third erase class is configured to provide a third erase voltage,
wherein the second erase voltage is higher than the first erase voltage, and lower than the third erase voltage.

12. The method of claim 10,
wherein the first erase class is configured to provide a first erase pulse, the second erase class is configured to provide a second erase pulse, the third erase class is configured to provide a third erase pulse,
wherein the second erase pulse is longer than the first erase pulse, and shorter than the third erase pulse.

13. The method of claim 8, wherein the memory controller comprises a RAM,
wherein the RAM is configured to store the off cell count and the determined erase class.

14. The method of claim 8, wherein the nonvolatile memory comprises a three dimensional flash memory cell array.

15. A method of operating a memory system, comprising:
determining an erase class from among a plurality of erase classes representative of a degree of shift in a threshold voltage for a plurality of cells in a memory block; and
erasing the memory block based on the determined erase class;
wherein determining the erase class comprises one of:
determining the erase class based on a an off cell count determined by performing a pre-reading operation on the plurality of cells in the memory block,
determining the erase class based on a voltage difference between a program verify voltage level for the plurality of memory cells in the memory block and a read voltage level for the plurality of memory cells in the memory block, and
determining the erase class based on a retention time associated with the plurality of memory cells in the memory block.

16. The method of claim 15, wherein a first erase class is associated with a first erase voltage and a second erase class is associated with a second erase voltage; and
wherein the first erase voltage is greater than the second erase voltage when the degree of shift associated with the first erase class is less than the degree of shift associated with the second erase class.

17. The method of claim 15, wherein a first erase class is associated with a first erase pulse duration and a second erase class is associated with a second erase pulse duration; and wherein the first erase pulse duration is greater than the second erase pulse duration when the degree of shift associated with the first erase class is less than the degree of shift associated with the second erase class.

* * * * *